(12) United States Patent
Hara et al.

(10) Patent No.: US 7,465,641 B2
(45) Date of Patent: Dec. 16, 2008

(54) METHOD FOR MANUFACTURING A SEMICONDUCTOR DEVICE

(75) Inventors: Toshiki Hara, Suwa (JP); Kei Kanemoto, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 198 days.

(21) Appl. No.: 11/393,211

(22) Filed: Mar. 29, 2006

(65) Prior Publication Data
US 2006/0223271 A1 Oct. 5, 2006

(30) Foreign Application Priority Data
Mar. 29, 2005 (JP) ............................. 2005-094776

(51) Int. Cl.
*H01L 21/76* (2006.01)
(52) U.S. Cl. .................. 438/401; 438/462; 257/E21.54
(58) Field of Classification Search ................ 438/401, 438/462; 257/E21.54
See application file for complete search history.

(56) References Cited

U.S. PATENT DOCUMENTS 6,815,308 B2 * 11/2004 Holscher et al. ............ 438/401

7,005,755 B2 * 2/2006 Yoshimura et al. .......... 257/797

FOREIGN PATENT DOCUMENTS

JP 2000-124092 4/2000
JP 2002-299591 10/2002

OTHER PUBLICATIONS

Sakai, et al., "Separation by Bonding Si Islands (SBSI) for LSI Applications," Second International SiGe Technology and Device Meeting, Meeting Abstract, pp. 230-231 (2004).

* cited by examiner

*Primary Examiner*—Charles D. Garber
*Assistant Examiner*—Stanetta D Isaac
(74) *Attorney, Agent, or Firm*—John J. Penny, Jr.; George N. Chaclas; Edwards Angell Palmer & Dodge LLP

(57) ABSTRACT

Manufacturing a semiconductor device by removing the insulation film in an alignment mark-forming region, depositing a first semiconductor layer, removing the insulation film on the semiconductor substrate after the second semiconductor layer is formed, forming a first exposing region for exposing the semiconductor substrate through the second semiconductor layer and the first semiconductor layer with reference to the second semiconductor layer in the alignment mark-forming region as a first alignment mark for positioning, while forming, on the semiconductor substrate, a second alignment mark, forming a second exposing region for exposing the first semiconductor layer by using the second alignment mark as a reference for positioning, forming a cavity and forming a buried insulation layer in the cavity, and forming a first grate electrode by using the second alignment mark as a reference for positioning.

4 Claims, 22 Drawing Sheets

METHOD FOR MANUFACTURING A SEMICONDUCTOR DEVICE

This application is a U.S. national application of Japanese application No. 2005-094776, filed in Japanese on Mar. 29, 2005, the disclosure of which is incorporated herein in its entirety by this reference.

BACKGROUND

1. Technical Field

The present invention relates to methods for manufacturing a semiconductor device and, in particular, is preferably applied to a method for manufacturing a field-effect transistor formed on a silicon-on-insulator (SOI) substrate.

2. Related Art

The availability of field-effect transistors formed on SOI substrates has been attracting a great deal of attention because of their effectiveness in device isolation, latchup-free property, small source/drain junction capacitance, etc. Especially, fully depleted SOI transistors have low power consumption and are capable of high-speed operation, which enables easy low-voltage operation. Much research for achieving the SOI transistor operation in fully depleted mode has been in progress. In such research, SOI substrates such as separation-by-implanted-oxygen (SIMOX) substrates, wafer bonding, etc. are used, as disclosed in the following patent applications: JP-A-2002-299591; and JP-A-2000-124092.

Further, in "Separation by Bonding Si Islands (SBSI) for LSI Application", by T. Sakai et al., Second International SiGe Technology and Device Meeting, Meeting Abstract, pp. 230-231, May (2004) (hereinafter "Sakai"), a method that achieves a low-cost formation of SOI transistors by forming a SOI layer on a bulk substrate has been disclosed. In the method disclosed Sakai, after depositing Si/SiGe layers on a Si substrate, a cavity is formed between the Si substrate and the Si layer by selectively removing only the SiGe layer using the difference in the selection ratios of Si and SiGe. Further, by performing thermal oxidation of the Si that is exposed in the cavity, an $SiO_2$ layer is buried between the Si substrate and the Si layer to form a BOX layer between the Si substrate and the Si layer.

In the above method disclosed in Sakai, a SOI transistor and a bulk transistor can simultaneously be formed on a single wafer. An SiGe layer is deposited only in a SOI transistor-forming region, not all over the wafer, by means of selective epitaxial growth. When an SiGe layer is deposited in a SOI transistor-forming region by means of selective epitaxial growth, an alignment mark used for mask positioning on the SOI transistor-forming region in the subsequent step is also formed by means of selective epitaxial growth of the SiGe layer. Further, by positioning a mask on the SOI transistor-forming region with reference to the alignment mark, the position of a device to be formed in the SOI transistor-forming region can be specified.

However, the alignment mark used for mask positioning on the SOI transistor-forming region has an Si/SiGe/Si configuration. Further, the alignment mark area becomes so large, depending on circumstances, that the SiGe of the alignment mark cannot completely be removed in removing the SiGe in the SOI transistor-forming region by means of etching. Furthermore, if any SiGe remains on the wafer, Ge is dispersed into the SOI layer in the subsequent heat treatment step, which causes not only the property degradation of devices to be formed on the SOI layer but also the Ge contamination of semiconductor manufacturing equipment, leading to a further Ge contamination of other wafers to be processed in the contaminated semiconductor manufacturing equipment.

On the other hand, even when the alignment mark having the Si/SiGe/Si configuration is small enough that the SiGe of the alignment mark can completely be removed in removing the SiGe in the SOI transistor-forming region by means of etching, the Si layer on the SiGe layer is lifted off to become a cause of particle generation.

SUMMARY

An advantage of the invention is to provide methods for manufacturing a semiconductor device that achieve a low-cost formation of a SOI configuration on a semiconductor substrate while controlling contamination due to a semiconductor layer that is used as an alignment mark.

According to a first aspect of the invention, a method for manufacturing a semiconductor device includes: forming an insulation film on a semiconductor substrate; selectively removing the insulation film in an alignment mark-forming region and an SOI structure-forming region, which are provided on the semiconductor substrate, by patterning the insulation film; selectively depositing a first semiconductor layer in the alignment mark-forming region and the SOI configuration-forming region by means of epitaxial growth; selectively depositing a second semiconductor layer, which has an etching rate smaller than an etching rate of the first semiconductor layer, on the first semiconductor layer by means of epitaxial growth; removing the insulation film on the semiconductor substrate after the second semiconductor layer is formed; forming a first exposing region for exposing the semiconductor substrate through the second semiconductor layer and the first semiconductor layer, by selectively etching the second semiconductor layer, the first semiconductor layer, and the semiconductor substrate with reference to the second semiconductor layer in the alignment mark-forming region as a first alignment mark for positioning, while forming, on the semiconductor-substrate, a second alignment mark that is specified with reference to positions of the second semiconductor layer and the first semiconductor layer in the alignment mark-forming region, by removing the second semiconductor layer and the first semiconductor layer in the alignment mark-forming region; forming a supporter, which is configured of a material having an etching rate smaller than an etching rate of the first semiconductor layer, for supporting the second semiconductor layer on the semiconductor substrate through the first exposing region; forming a second exposing region for exposing the first semiconductor layer, after forming the supporter, by using the second alignment mark as a reference for positioning; forming a cavity, where the first semiconductor layer is removed, between the semiconductor substrate and the second semiconductor layer by selectively etching the first semiconductor layer through the second exposing region; forming a buried insulation layer that is buried in the cavity; forming a first gate electrode, which is provided through a first gate insulation film, on the second semiconductor layer by using the second alignment mark as a reference for positioning; and forming first source/drain layers, which are provided so as to sandwich the first gate electrode, on the second semiconductor layer.

By the above method, the second alignment mark corresponding to the first alignment mark position can be formed in the alignment mark-forming region after removing the first semiconductor layer and the second semiconductor layer that are formed in the alignment mark-forming region. Hence, even when the first semiconductor layer under the second semiconductor layer is removed, the second semiconductor layer can be prevented from becoming a cause of particle generation. Also, even when the heat treatment of a wafer is performed after a cavity is formed under the second semiconductor layer, the contamination of the second semiconductor layer due to a component contained in the first semiconductor layer can be prevented and therefore the degradation of device properties can be prevented.

Further, according to a second aspect of the invention, a method for manufacturing a semiconductor device includes: forming an insulation film on an semiconductor substrate; selectively removing the insulation film in an alignment mark-forming region and an SOI configuration-forming region, which are provided on the semiconductor substrate, by patterning the insulation film; selectively depositing a first semiconductor layer in the alignment mark-forming region and the SOI configuration-forming region by means of epitaxial growth; selectively depositing a second semiconductor layer, which has an etching rate smaller than an etching rate of the first semiconductor layer, on the first semiconductor layer by means of epitaxial growth; removing the insulation film on the semiconductor substrate after the second semiconductor layer is formed; forming a first exposing region for exposing the semiconductor substrate through the second semiconductor layer and the first semiconductor layer, by selectively etching the second semiconductor layer, the first semiconductor layer, and the semiconductor substrate in the SOI configuration-forming region; forming a supporter, which is configured of a material having an etching rate smaller than an etching rate of the first semiconductor layer, for supporting the second semiconductor layer on the semiconductor substrate through the first exposing region; forming a second exposing region for exposing the first semiconductor layer, by selectively etching the supporter, the second semiconductor layer, the first semiconductor layer, and the semiconductor substrate with reference to the second semiconductor layer in the alignment mark-forming region as a first alignment mark for positioning, while forming, on the semiconductor substrate, a second alignment mark that is specified with reference to positions of the second semiconductor layer and the first semiconductor layer in the alignment mark-forming region, by removing the second semiconductor layer and the first semiconductor layer in the alignment mark-forming region; forming a cavity, where the first semiconductor layer is removed, between the semiconductor substrate and the second semiconductor layer by selectively etching the first semiconductor layer through the second exposing region; forming a buried insulation layer that is buried in the cavity; forming a first gate electrode, which is provided through a first gate insulation film, on the second semiconductor layer by using the second alignment mark as a reference for positioning; and forming first source/drain layers, which are provided so as to sandwich the first gate electrode, on the second semiconductor layer.

By the above method, the second alignment mark corresponding to the first alignment mark position can be formed in the alignment mark-forming region after removing the first semiconductor layer and the second semiconductor layer that are formed in the alignment mark-forming region. Hence, even when the first semiconductor layer under the second semiconductor layer is removed, the second semiconductor layer can be prevented from becoming a cause of particle generation. Also, even when the heat treatment of a wafer is performed after a cavity is formed under the second semiconductor layer, the contamination of the second semiconductor layer due to a component contained in the first semiconductor layer can be prevented and therefore the degradation of device properties can be prevented.

Further, according to a third aspect of the invention, a method for manufacturing a semiconductor device includes: forming an insulation film on a semiconductor substrate; selectively removing the insulation film in an alignment mark-forming region and an SOI configuration-forming region, which are provided on the semiconductor substrate, by patterning the insulation film; selectively depositing a first semiconductor layer in the alignment mark-forming region and the SOI configuration-forming region by means of epitaxial growth; selectively depositing a second semiconductor layer, which has an etching rate smaller than an etching rate of the first semiconductor layer, on the first semiconductor layer by means of epitaxial growth; removing the insulation film on the semiconductor substrate after the second semiconductor layer is formed; forming a first exposing region for exposing the semiconductor substrate through the second semiconductor layer and the first semiconductor layer, by selectively etching the second semiconductor layer, the first semiconductor layer, and the semiconductor substrate with reference to the second semiconductor layer in the alignment mark-forming region as an alignment mark for positioning; forming a supporter, which is configured of a material having an etching rate smaller than an etching rate of the first semiconductor layer, for supporting the second semiconductor layer on the semiconductor substrate through the first exposing region so that the supporter covers the first semiconductor layer and the second semiconductor layer in the alignment mark-forming region; forming a second exposing region for exposing the first semiconductor layer, after forming the supporter, by using the alignment mark as a reference for positioning; forming a cavity, where the first semiconductor layer is removed, between the semiconductor substrate and the second semiconductor layer by selectively etching the first semiconductor layer through the second exposing region; forming a buried insulation layer that is buried in the cavity; forming a first gate electrode, which is provided through a first gate insulation film, on the second semiconductor layer by using the alignment mark as a reference for positioning; and forming first source/drain layers, which are provided so as to sandwich the first gate electrode, on the second semiconductor layer.

By the above method, a cavity can be formed under the second semiconductor layer in the SOI configuration-forming region, with the first semiconductor layer and the second semiconductor layer, which are formed in the alignment mark-forming region, covered with the supporter. Hence, even when the first semiconductor layer under the second semiconductor layer in the SOI configuration-forming region is removed, the second semiconductor layer in the alignment mark-forming region can be prevented from becoming a cause of particle generation. Also, even when the heat treatment of a wafer is performed after a cavity is formed under the second semiconductor layer in the SOI configuration-forming region, the contamination of the second semiconductor layer due to a component contained in the first semiconductor layer can be prevented and therefore the degradation of device properties can be prevented.

Further, according to a fourth aspect of the invention, a method for manufacturing a semiconductor device includes: forming a first insulation film on a semiconductor substrate; forming an alignment mark in an alignment mark-forming region, which is provided on the semiconductor substrate, by patterning the first insulation film, while selectively removing the first insulation film in an SOI configuration-forming region, which is provided on the semiconductor substrate; covering the alignment mark, which is formed in the alignment mark-forming region, with a second insulation film that has a refractive index different from a refractive index of the first insulation film; selectively depositing a first semiconductor layer in the SOI configuration-forming region by means of epitaxial growth; selectively depositing a second semiconductor layer, which has an etching rate smaller than an etching rate of the first semiconductor layer, on the first semiconductor layer by means of epitaxial growth; forming a first exposing region for exposing the semiconductor substrate through the second semiconductor layer and the first semiconductor layer, by selectively etching the second semiconductor layer, the first semiconductor layer, and the semiconductor substrate using the alignment mark in the alignment mark-forming region as a reference for positioning; forming a supporter, which is configured of a material having an etching rate smaller than an etching rate of the first semiconductor layer, for supporting the second semiconductor layer on the semiconductor substrate through the first exposing region; forming a second exposing region for exposing the first semiconductor layer, after forming the supporter, by using the alignment mark as a reference for positioning; forming a cavity, where the first semiconductor layer is removed, between the semiconductor substrate and the second semiconductor layer by selectively etching the first semiconductor layer through the second exposing region; forming a buried insulation layer that is buried in the cavity; forming a first gate electrode, which is provided through a first gate insulation film, on the second semiconductor layer by using the alignment mark as a reference for positioning; and forming first source/drain layers, which are provided so as to sandwich the first gate electrode, on the second semiconductor layer.

By the above method, an alignment mark for specifying the position of the SOI configuration-forming region can be formed in the alignment mark-forming region without forming the first semiconductor layer and the second semiconductor layer in the alignment mark-forming region. Hence, even when the first semiconductor layer under the second semiconductor layer is removed, the second semiconductor layer can be prevented from becoming a cause of particle generation. Also, even when the heat treatment of a wafer is performed after a cavity is formed under the second semiconductor layer, the contamination of the second semiconductor layer due to a component contained in the first semiconductor layer can be prevented and therefore the degradation of device properties can be prevented.

Further, the first to fourth aspects of the invention further includes: forming a second gate electrode in a bulk configuration-forming region, which is provided on the semiconductor substrate, through a second gate insulation film; and forming second source/drain layers, which are provided so as to sandwich the second gate electrode, on the semiconductor substrate.

By the above method, an SOI configuration can be formed in a region that is part of the semiconductor substrate, while reducing the possibility of defects in the second semiconductor layer. At the same time, a bulk configuration can also be formed in another region on the semiconductor substrate. Therefore, an SOI configuration and a bulk configuration can be formed on a single semiconductor substrate without using an SOI substrate, which controls cost increase and makes it possible to achieve the mixed mounting of an SOI transistor and a high-breakdown-voltage transistor on a single semiconductor substrate.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of methods for manufacturing a semiconductor device according to the invention will now be described with reference to the accompanying drawings.

FIGS. 1A to 8A are plan views showing a method for manufacturing a semiconductor device according to a first embodiment of the invention. FIGS. 1B to 8B are cross sections that are respectively taken along the lines A1-A1' to A8-A8' in FIGS. 1A to 8A. FIGS. 1C to 8C are cross sections that are respectively taken along the lines B1-B1' to B8-B8' in FIGS. 1A to 8A.

Figure 1A:
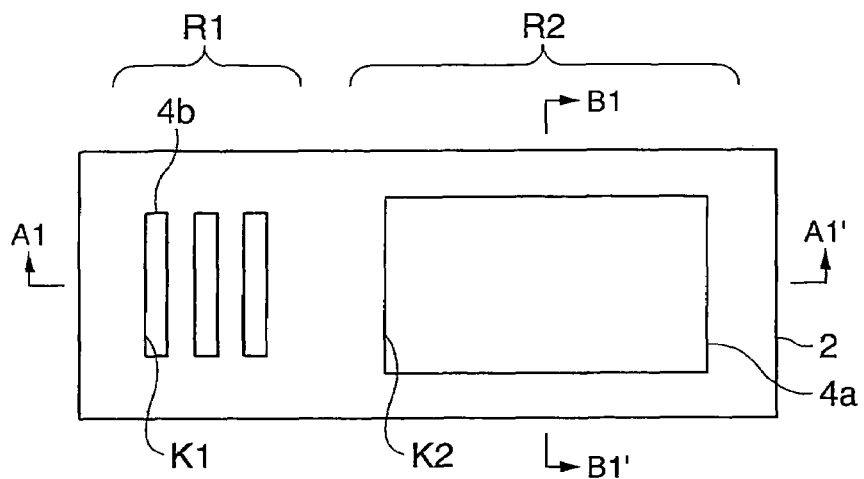
FIGS. 1A to 1C are diagrams showing a method for manufacturing a semiconductor device according to a first embodiment of the invention.
Figure 1B:
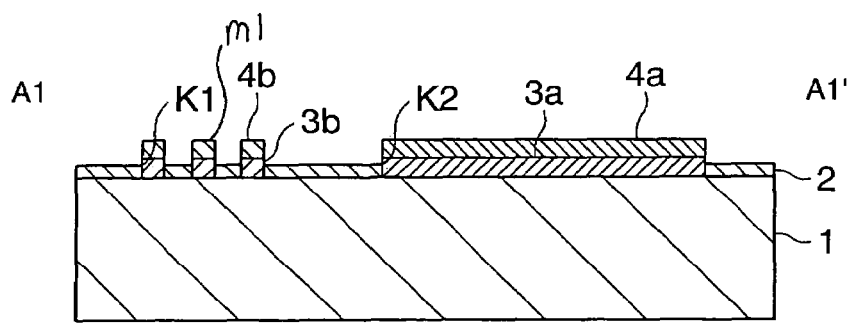
Figure 1C:
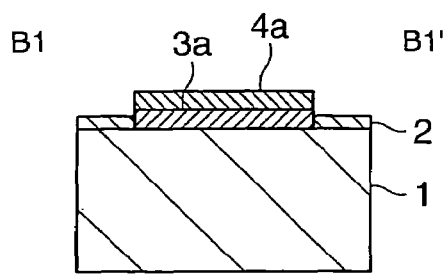

In FIGS. 1A to 1C, an alignment mark-forming region R1 for forming a first alignment mark m1 and a second alignment mark 6 and a SOI configuration-forming region R2 for forming a SOI configuration are provided on a semiconductor substrate 1. Then, an oxide film 2 is formed all over the semiconductor substrate 1 by means of thermal oxidation, etc. Further, by patterning the oxide film 2 by means of photolithography and etching, an opening K1 for placing the first alignment mark in the alignment mark-forming region R1 and another opening K2 for placing a SOI configuration in the SOI configuration-forming region R2 are formed. Furthermore, by performing selective epitaxial growth, a first semiconductor layer 3a and a second semiconductor layer 4a are sequentially formed in the SOI configuration-forming region R2, while another first semiconductor layer 3b and another second semiconductor layer 4b are sequentially formed in the alignment mark-forming region R1.

In the above step of selective epitaxial growth, the first semiconductor layers 3a and 3b and the second semiconductor layers 4a and 4b are deposited by means of thermal CVD while supplying material gases for forming each of the first semiconductor layers 3a and 3b and the second semiconductor layers 4a and 4b. Then, on the semiconductor substrate 1 that is exposed through the openings K1 and K2, single-crystal semiconductor layers can be deposited as the first semiconductor layers 3a and 3b and the second semiconductor layers 4a and 4b. In the above step, wherein an amorphous semiconductor layer is deposited on the oxide film 2 when the single-crystal semiconductor layer is deposited on the semiconductor substrate 1, the amorphous semiconductor layer can be decomposed and removed, while retaining the single-crystal semiconductor layer deposited on the semiconductor substrate 1, by exposing the amorphous semiconductor layer to a chlorine gas, etc. Therefore, by performing selective epitaxial growth, each of the first semiconductor layers 3a and 3b and the second semiconductor layers 4a and 4b can be formed on the semiconductor substrate 1 that is exposed through the openings K1 and K2.

In addition, as the first semiconductor layers 3a and 3b, a material having an etching rate larger than those of the semiconductor substrate 1 and the second semiconductor layers 4a and 4b can be used. The materials to be used as the semiconductor substrate 1, the first semiconductor layers 3a and 3b, and the second semiconductor layers 4a and 4b can be any combination of, for example: Si, Ge, SiGe, SiC, SiSn, PbS, GaAs, InP, GaP, GaN, ZnSe, etc. Especially, when the semiconductor substrate 1 is Si, it is preferable to use SiGe as the first semiconductor layers 3a and 3b and Si as the second semiconductor layers 4a and 4b. By the above method, the selection ratio of the first semiconductor layers 3a and 3b to the second semiconductor layers 4a and 4b can be secured, while achieving the lattice matching between the first semiconductor layers 3a and 3b and the second semiconductor layers 4a and 4b. As the first semiconductor layers 3a and 3b, not only single-crystal semiconductor layers but also poly-crystal semiconductor layers, amorphous semiconductor layers, or porous semiconductor layers can be used. Further, instead of the first semiconductor layers 3a and 3b, the use of metal oxide films, such as γ-alumina oxide, that can be deposited by performing epitaxial growth of single-crystal semiconductor layers can also be accepted. Furthermore, the thicknesses of the first semiconductor layers 3a and 3b and the second semiconductor layers 4a and 4b can be set to approximately 1 to 100 nm, for example.

Figure 2A:
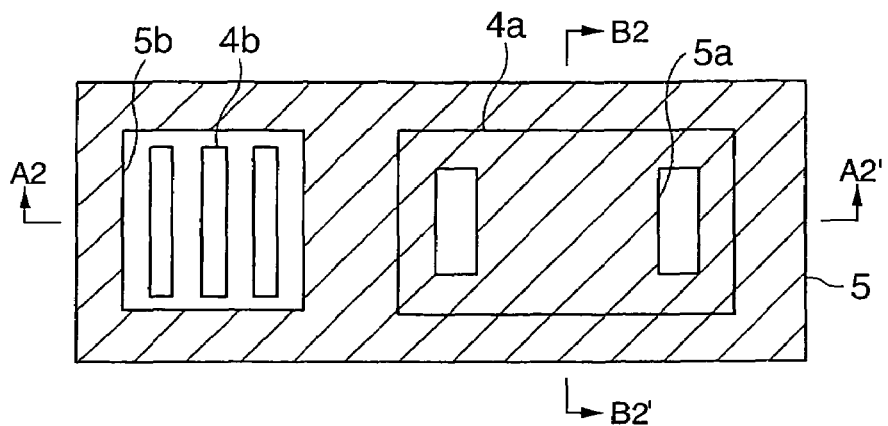
FIGS. 2A to 2C are other diagrams showing the method for manufacturing a semiconductor device according to the first embodiment of the invention.
Figure 2B:
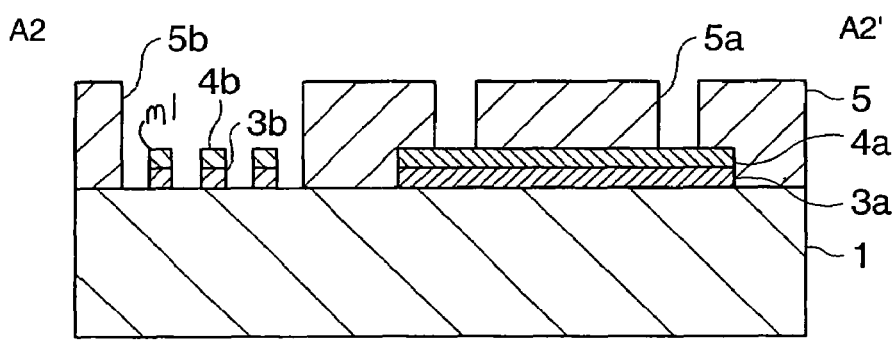
Figure 2C:
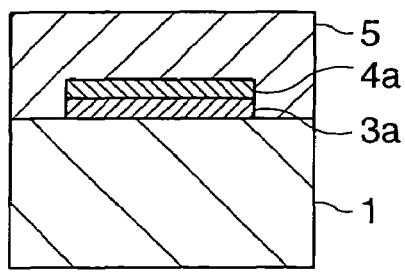

Next, as shown in FIGS. 2A to 2C, after forming the first semiconductor layers 3a and 3b and the second semiconductor layers 4a and 4b, the oxide film 2 on the semiconductor substrate 1 is removed. Then, by means of photolithography, a photoresist pattern 5 wherein an opening 5a for exposing part of the second semiconductor layer 4a in the SOI configuration-forming region R2 and another opening 5b for exposing the alignment mark-forming region R1 are provided is formed on the semiconductor substrate L In the above step for forming the photoresist pattern 5 having the openings 5a and 5b on the semiconductor substrate 1, the positioning of an exposure mask can be performed with reference to the first alignment mark m1 that is configured of the first semiconductor layer 3b and the second semiconductor layer 4b.

Figure 3A:
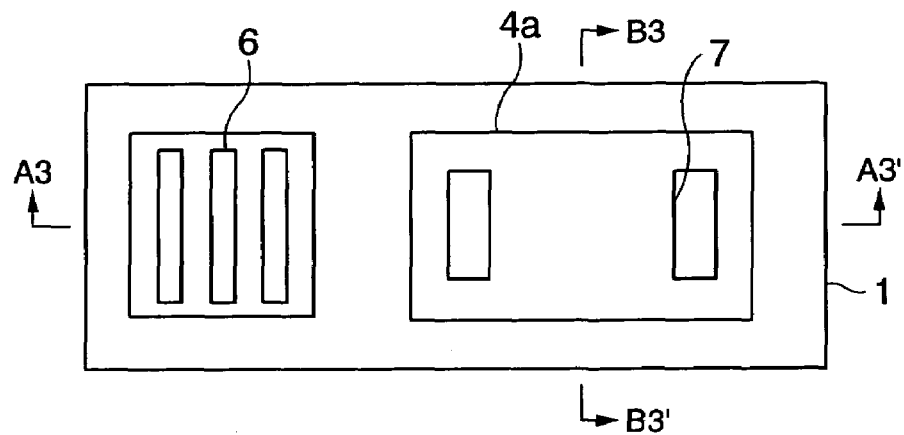
FIGS. 3A to 3C are yet other diagrams showing the method for manufacturing a semiconductor device according to the first embodiment of the invention.
Figure 3B:
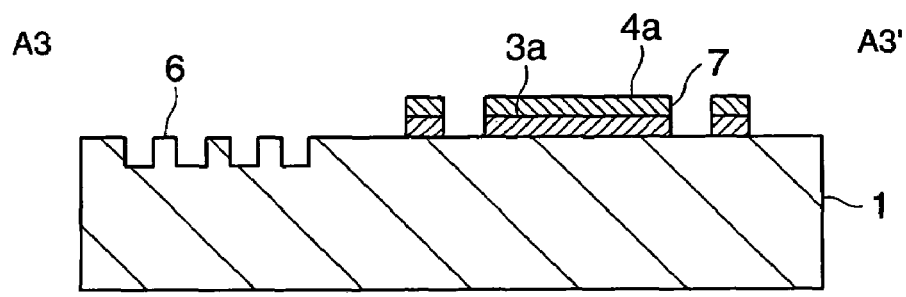
Figure 3C:
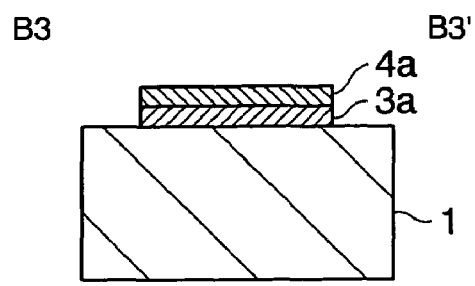

Next as shown in FIGS. 3A to 3C, by etching the semiconductor substrate 1, the second semiconductor layer 4a, and the first semiconductor layer 3a using the photoresist pattern 5 as a mask, an opening 7 for exposing part of the semiconductor substrate 1 in the SOI configuration-forming region R2 is formed; and, after removing the second semiconductor layer 4b and the first semiconductor layer 3b in the alignment mark-forming region R1, a second alignment mark 6 is formed on the semiconductor substrate 1 in the alignment mark-forming region R1. Then, after completing the formation of the opening 7 in the SOI configuration-forming region R2 and the second alignment mark 6 in the alignment mark-forming region R1, the photoresist pattern 5 is removed. In the above step, since the semiconductor substrate 1 in the alignment mark-forming region R1 is etched using the second semiconductor layer 4b and the first semiconductor layer 3b as a mask, the second alignment mark 6 can be provided self-alignedly in a position corresponding to the second semiconductor layer 4b and the first semiconductor layer 3b.

In addition, in order to expose part of the semiconductor substrate 1 in the SOI configuration-forming region R2, etching can be performed in either of the following manners: the surface of the semiconductor substrate 1 is not etched at all; or the semiconductor substrate 1 is overetched to form a concavity in the semiconductor substrate 1. Further, the opening 7 can be provided in a position partially overlapping the device isolation region of the second semiconductor layer 4a.

Figure 4A:
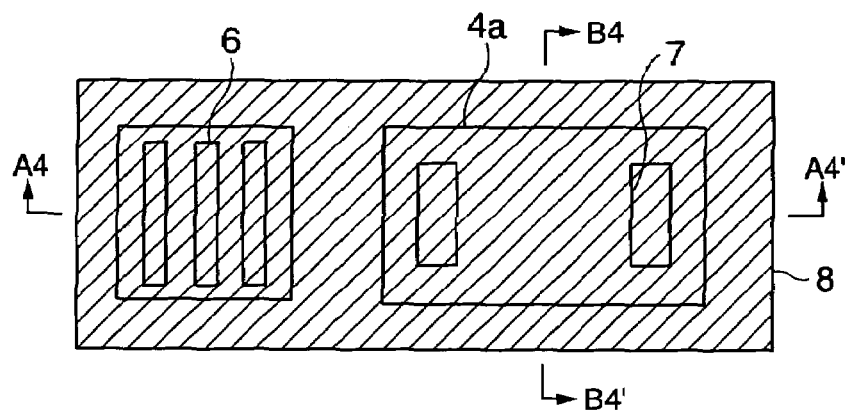
FIGS. 4A to 4C are yet other diagrams showing the method for manufacturing a semiconductor device according to the first embodiment of the invention.
Figure 4B:
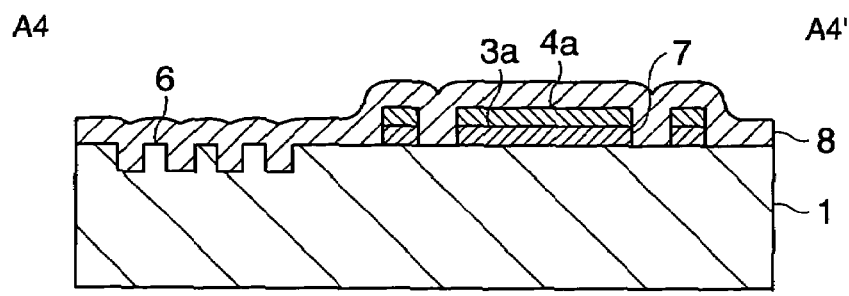
Figure 4C:
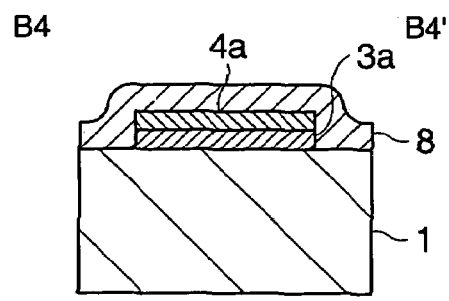

Next, as shown in FIGS. 4A to 4C, a supporter 8 is deposited all over the semiconductor substrate 1 by means of CVD, etc. In addition, the supporter 8 is deposited also on the side walls of the first semiconductor layer 3a and the second semiconductor layer 4a in the opening 7 so that the second semiconductor layer 4a can be supported by the semiconductor substrate 1. Further, as the material of the supporter 8, insulators such as silicon oxide films and silicon nitride films can be used. Alternatively, semiconductors such as polycrystal silicon, single-crystal silicon, etc. can also be used as the material of the supporter 8.

Figure 5A:
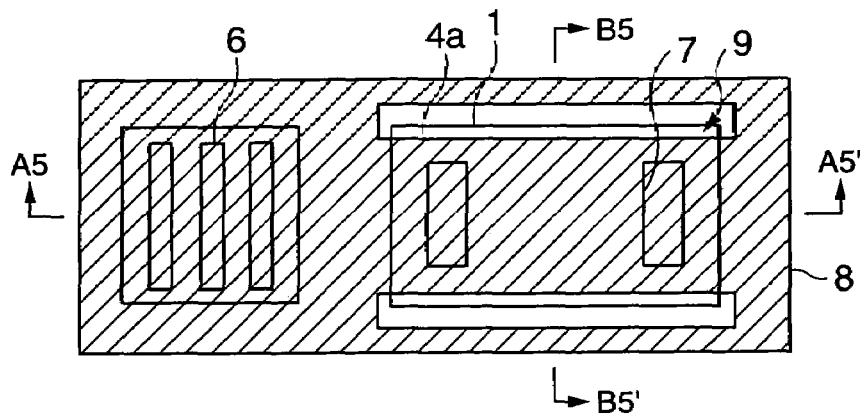
FIGS. 5A to 5C are yet other diagrams showing the method for manufacturing a semiconductor device according to the first embodiment of the invention.
Figure 5B:
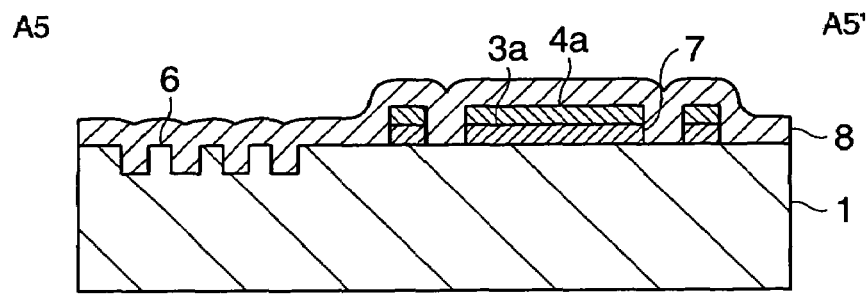
Figure 5C:
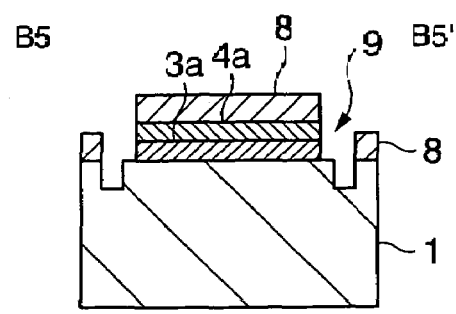

Next, as shown in FIGS. 5A to 5C, an exposing surface 9 for exposing part of the first semiconductor layer 3a in the SOI configuration-forming region R2 is formed by patterning the supporter 8, the second semiconductor layer 4a, and the first semiconductor layer 3a by means of photolithography and etching. In the above step for forming the exposing surface 9 for exposing part of the first semiconductor layer 3a, the positioning of an exposure mask in the photolithography step can be performed with reference to the second alignment mark 6 that is formed in the alignment mark-forming region R1.

Further, the exposing surface 9 can be provided in a position partially overlapping the device isolation region of the second semiconductor layer 4a. In addition, in order to expose part of the first semiconductor layer 3a in the SOI configuration-forming region R2, etching can be performed in either of the following manners: the surface of the first semiconductor layer 3a is not etched at all; or the first semiconductor layer 3a is overetched to form a concavity in the first semiconductor layer 3a. Alternatively, the surface of the semiconductor substrate 1 can be exposed through the first semiconductor layer 3a on which the exposing surface 9 is to be formed. In the above step, the surface of the semiconductor substrate 1 in the SOI configuration-forming region R2 can be prevented from being exposed by stopping the etching halfway of the first semiconductor layer 3a. Therefore, the time for the semiconductor substrate 1 in the SOI configuration-forming region R2 to be exposed to an etching liquid or an etching gas in removing the first semiconductor layer 3a can be reduced, which makes it possible to control the overetching of the semiconductor substrate 1 in the SOI configuration-forming region R2.

Figure 6A:
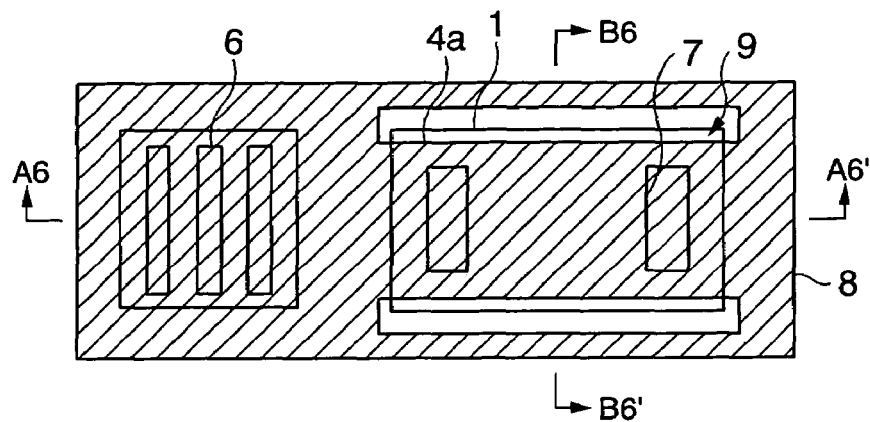
FIGS. 6A to 6C are yet other diagrams showing the method for manufacturing a semiconductor device according to the first embodiment of the invention.
Figure 6B:
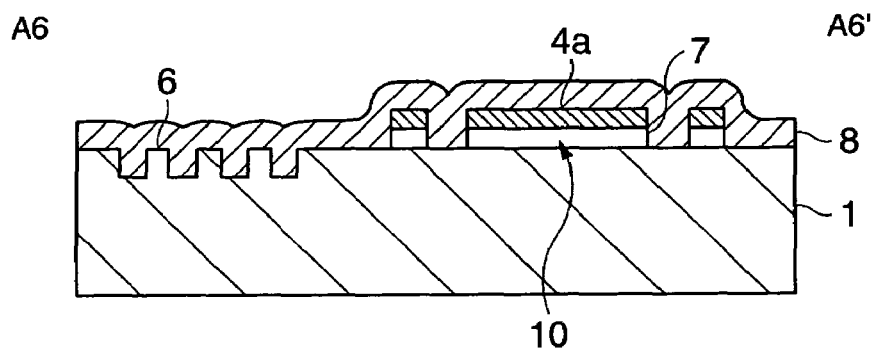
Figure 6C:
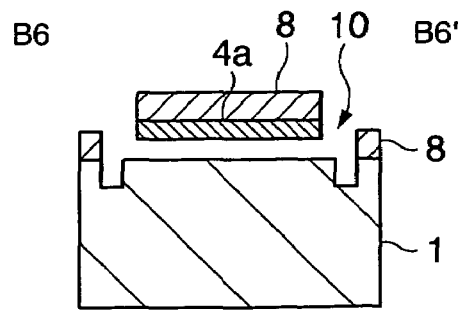

Next, as shown in FIGS. 6A to 6C, a cavity 10 is formed between the semiconductor substrate 1 and the second semiconductor layer 4a by removing the first semiconductor layer 3a by bringing an etching gas or an etching liquid into contact with the first semiconductor layer 3a.

In the above step, by providing the supporter 8 into the opening 7, the second semiconductor layer 4a can be supported by the semiconductor substrate 1 even after the first semiconductor layer 3a is removed. At the same time, by providing the exposing surface 9 separately from the opening 7, an etching gas or an etching liquid can be brought into contact with the first semiconductor layer 3a provided under the second semiconductor layer 4a even after the second semiconductor layer 4a is deposited on the first semiconductor layer 3a.

Hence, the second semiconductor layer 4a can be provided on an insulator while reducing the possibility of defects in the second semiconductor layer 4a. At the same time, the insulation between the second semiconductor layer 4a and the semiconductor substrate 1 can be achieved without degrading the quality of the second semiconductor layer 4a.

In addition, it is preferable to use hydrofluoric acid-nitric acid mixture (a mixture containing hydrofluoric acid, nitric acid, and water) as the etching liquid for the first semiconductor layer 3a when the semiconductor substrate 1 and the second semiconductor layer 4a are Si and the first semiconductor layer 3a is SiGe. By the above method, a selection ratio of Si to SiGe of 1:100 to 1000, approximately, can be derived, which makes it possible to remove the first semiconductor layer 3a while controlling the overetching of the semiconductor substrate 1 and the second semiconductor layer 4a. Further, as the etching liquid for the first semiconductor layer 3a, hydrofluoric acid-nitric acid-hydrogen peroxide mixture, ammonia hydrogen peroxide mixture, or hydrofluoric acid-acetic acid-hydrogen peroxide mixture, etc. can also be used.

Further, before removing the first semiconductor layer 3a, the first semiconductor layer 3a can be processed to be porous by means of anodic oxidation, etc. or amorphous by means of ion implantation into the first semiconductor layer 3a. By such a method, the etching rate of the first semiconductor layer 3a can be increased and the etching area of the first semiconductor layer 3a can be enlarged while controlling the overetching of the second semiconductor layer 4a.

Figure 7A:
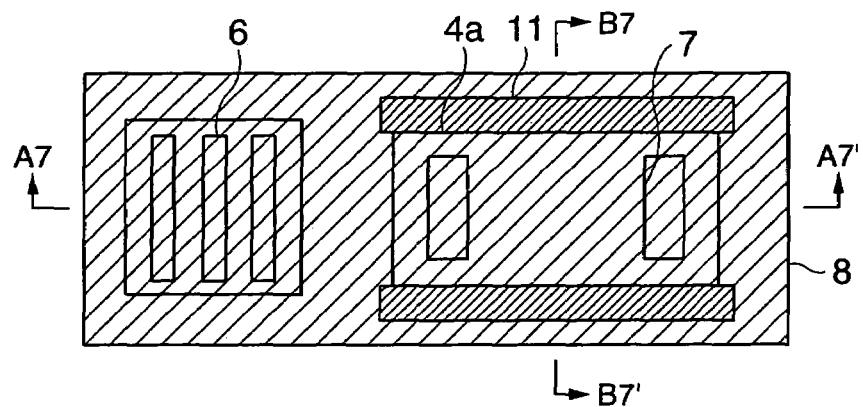
FIGS. 7A to 7C are yet other diagrams showing the method for manufacturing a semiconductor device according to the first embodiment of the invention.
Figure 7B:
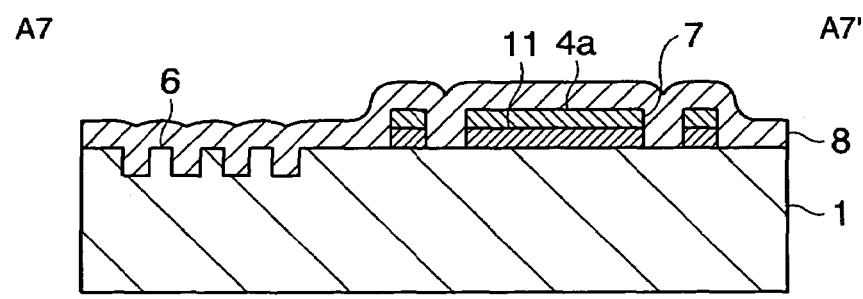
Figure 7C:
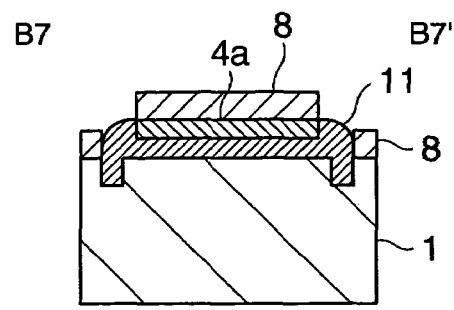

Next, as shown in FIGS. 7A to 7C, a buried insulation layer 11 is formed in the cavity 10 between the semiconductor substrate 1 and the second semiconductor layer 4a by performing the thermal oxidation of the semiconductor substrate 1 and the second semiconductor layer 4a. In addition, annealing at a high temperature of 1000 degrees Celsius or higher can also be performed after forming the buried insulation layer 11 in the cavity 10. By the above step, the supporter 8 can be made to reflow, which applies a stress pressing down on the second semiconductor layer 4a to form the buried insulation layer 11 without any gap. Also, the buried insulation layer 11 can be formed so as either to completely fill the cavity 10 or to partially fill the cavity 10.

Besides the method in FIGS. 7A to 7C, wherein the buried insulation layer 11 is formed in the cavity 10 between the semiconductor substrate 1 and the second semiconductor layer 4a by means of thermal oxidation of the semiconductor substrate 1 and the second semiconductor layer 4a, it is also acceptable to fill the cavity 10 between the semiconductor substrate 1 and the second semiconductor layer 4a with the buried insulation layer 11 by depositing an insulation film into the cavity 10 between the semiconductor substrate 1 and the second semiconductor layer 4a by means of CVD. By such a method, it becomes possible to fill the cavity 10 between the semiconductor substrate 1 and the second semiconductor layer 4a with any material other than oxide films, while preventing the reduction in thickness of the second semiconductor layer 4a. Therefore, the buried insulation layer 11 to be provided on the back surface of the second semiconductor layer 4a can be made thicker and the dielectric constant can also be lowered, which reduces the parasitic capacitance on the back surface of the second semiconductor layer 4a.

In addition, as the material of the buried insulation layer 11, materials such as fluorinated-silicate-glass (FSG) films, silicon nitride films, etc. can also be used, as well as silicon oxide films. Further, the buried insulation layer 11 can be configured of, other than spin-on-glass (SOG) films, organic low-k films such as PSG films, BPSG films, polyaryleneether (PAE)-series films, hydrogen silsesquioxane (HSQ)-series films, methyl silsesquioxane (MSQ)-series films, PCB-series films, CF-series films, SiOC-series films, SiOF-series films, etc., or the porous films of the same.

Figure 8A:
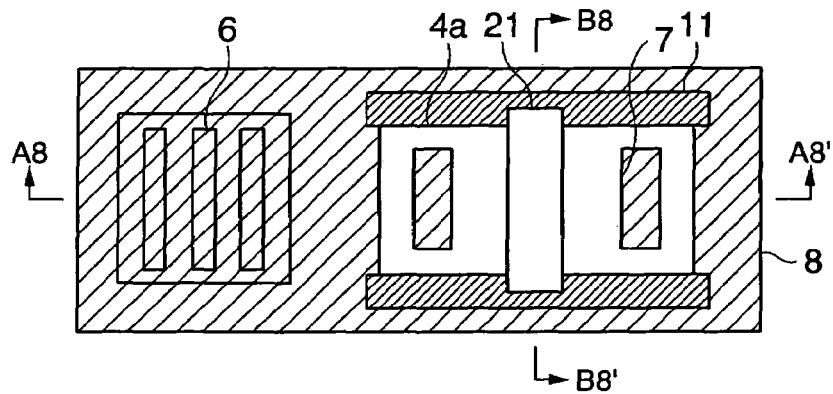
FIGS. 8A to 8C are yet other diagrams showing the method for manufacturing a semiconductor device according to the first embodiment of the invention.
Figure 8B:
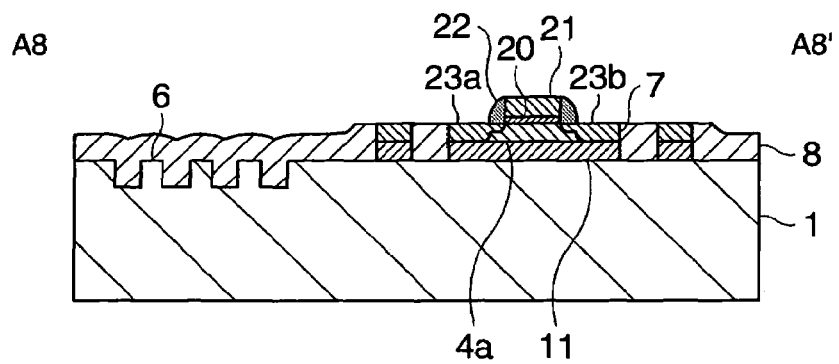
Figure 8C:
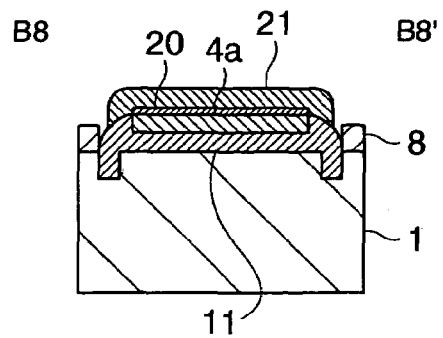

Next, as shown in FIGS. 8A to 8C, the surface of the second semiconductor layer 4a in the SOI configuration-forming region R2 is exposed by etching the supporter 8 by means of photolithography and etching, combining with, according to need, methods such as etch-back, chemical mechanical polishing (CMP), etc.

Then, a gate insulation film 20 is formed on the surface of the second semiconductor layer 4a by performing the thermal oxidation of the surface of the second semiconductor layer 4a. Further, a polycrystal silicon layer is formed on the second semiconductor layer 4a, which has the gate insulation film 20 on, by means of CVD, etc. Furthermore, a gate electrode 21 is formed on the second semiconductor layer 4a by patterning the polycrystal silicon layer by means of photolithography and etching. In the above step for forming the gate electrode 21, the positioning of an exposure mask in the photolithography step can be performed with reference to the second alignment mark 6 that is formed in the alignment mark-forming region R1.

Next, using the gate electrode 21 as a mask, LDD layers that are configured of low-concentration impurity introduction layers provided on both sides of the gate electrode 21 is formed on the second semiconductor layer 4a by performing the ion implantation of an impurity, such as As, P, B, etc., into the second semiconductor layer 4a. Then, after forming an insulation layer on the second semiconductor layer 4a, which has the LDD layer on, by means of CVD, etc., side walls 22 are formed on the sides of the gate electrode 21 by etching-back the insulation layer by means of anisotropic etching such as RIE, etc. Further, using the gate electrode 21 and the side walls 22 as a mask, source/drain layers 23a and 23b that are configured of high-concentration impurity introduction layers provided next to each of the side walls 22 are formed by performing the ion implantation of an impurity, such as As, P, B, etc., into the second semiconductor layer 4a.

By the above method, the second alignment mark 6 corresponding to the first alignment mark position can be formed in the alignment mark-forming region R1 after removing the first semiconductor layer 3b and the second semiconductor layer 4b that are formed in the alignment mark-forming region R1. Hence, even when the first semiconductor layer 3a under the second semiconductor layer 4a in the SOI configuration-forming region R2 is removed, the second semiconductor layer 4b in the alignment mark-forming region R1 can be prevented from becoming a cause of particle generation. Also, even when the heat treatment of a wafer is performed after the cavity 10 is formed under the second semiconductor layer 4a in the SOI configuration-forming region R2, the contamination of the second semiconductor layer 4a due to a component contained in the first semiconductor layers 3a and 3b can be prevented and therefore the degradation of device properties can be prevented.

In the first embodiment described above, a method for forming a SOI transistor in the SOI configuration-forming region R2 has been described. However, in addition to a SOI transistor in the SOI configuration-forming region R2, a bulk transistor can also be formed, on the semiconductor substrate 1. By such a method, a SOI configuration and a bulk configuration can be formed together on the same semiconductor substrate 1 without using a SOI substrate, which controls cost increase and makes it possible to achieve the mixed mounting of a SOI transistor and a high-breakdown-voltage transistor on the same semiconductor substrate 1.

FIGS. 9A to 14A are plan views showing a method for manufacturing a semiconductor device according to a second embodiment of the invention. FIGS. 9B to 14B are cross sections that are respectively taken along the lines A11-A11' to A16-A16' in FIGS. 9A to 14A. FIGS. 9C to 14C are cross sections that are respectively taken along the lines B11-B11' to B16-B16' in FIGS. 9A to 14A.

Figure 9A:
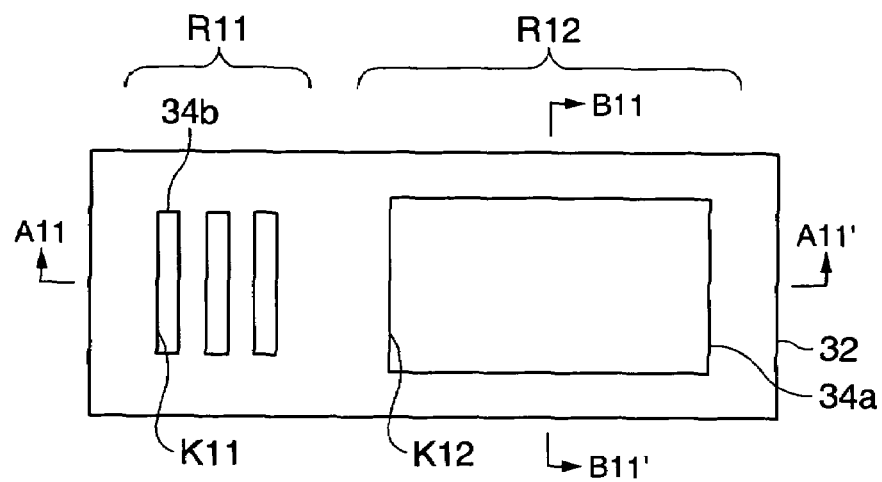
FIGS. 9A to 9C are diagrams showing a method for manufacturing a semiconductor device according to a second embodiment of the invention.
Figure 9B:
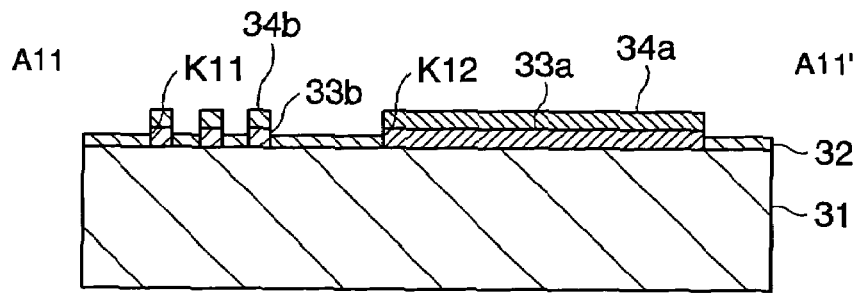
Figure 9C:
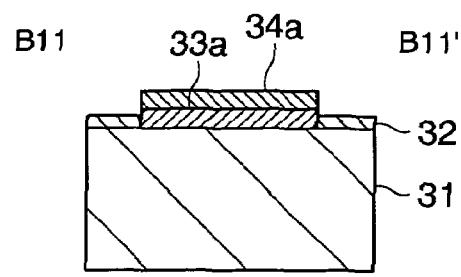

In FIGS. 9A to 9C, an alignment mark-forming region R11 for forming a first alignment mark and a second alignment mark 36 and an SOI configuration-forming region R12 for forming an SOI configuration are provided on a semiconductor substrate 31. Then, an oxide film 32 is formed all over the semiconductor substrate 31 by means of thermal oxidation, etc. Further, by patterning the oxide film 32 by means of photolithography and etching, an opening K11 for placing the first alignment mark in the alignment mark-forming region R11 and another opening K12 for placing an SOI configuration in the SOI configuration-forming region R12 are formed. Furthermore, by performing selective epitaxial growth, a first semiconductor layer 33a and a second semiconductor layer 34a are sequentially formed in the SOI configuration-forming region R12, while another first semiconductor layer 33b and another second semiconductor layer 34b are sequentially formed in the alignment mark-forming region R11.

Figure 10A:
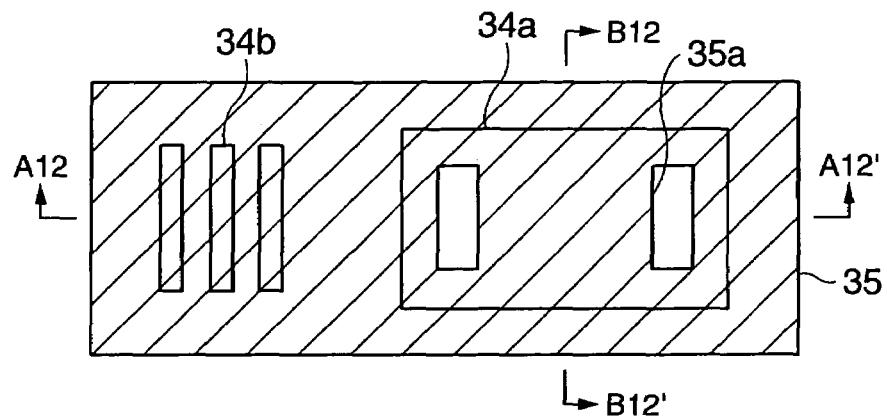
FIGS. 10A to 10C are other diagrams showing the method for manufacturing a semiconductor device according to the second embodiment of the invention.
Figure 10B:
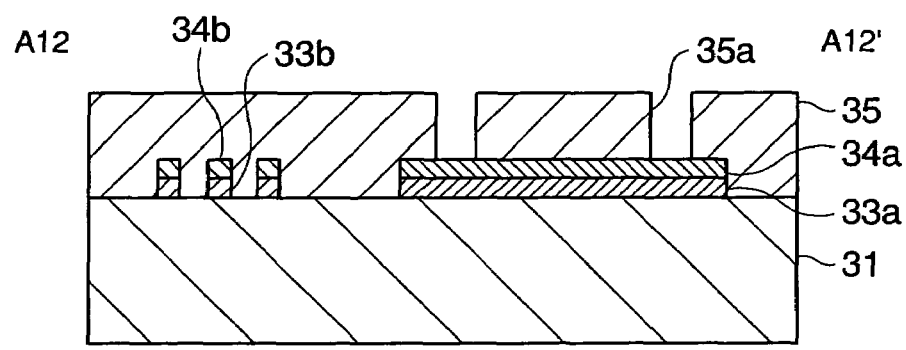
Figure 10C:
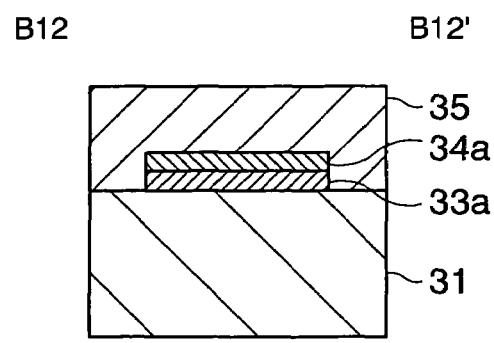

Next, as shown in FIGS. 10A to 10C, after forming the first semiconductor layers 33a and 33b and the second semiconductor layers 34a and 34b, the oxide film 32 on the semiconductor substrate 31 is removed. Then, by means of photolithography, a photoresist pattern 35 wherein an opening 35a for exposing part of the second semiconductor layer 34a in the SOI configuration-forming region R12 is provided is formed on the semiconductor substrate 31. In the above step for forming the photoresist pattern 35, having the opening 35a, on the semiconductor substrate 31, the positioning of an exposure mask can be performed with reference to the first alignment mark that is configured of the first semiconductor layer 33b and the second semiconductor layer 34b.

Figure 11A:
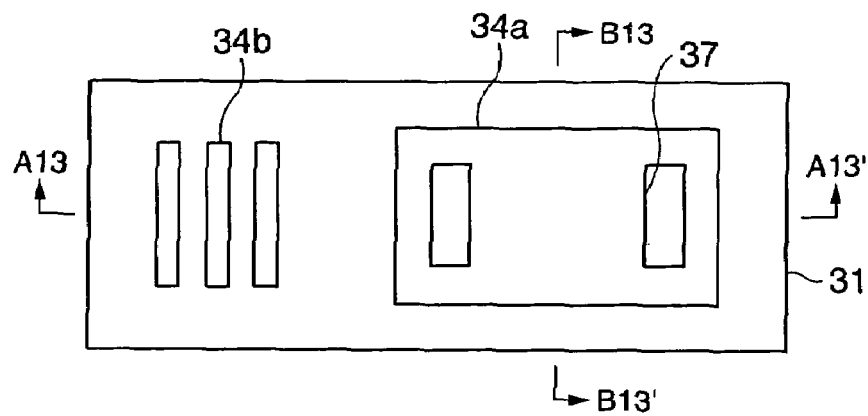
FIGS. 11A to 11C are yet other diagrams showing the method for manufacturing a semiconductor device according to the second embodiment of the invention.
Figure 11B:
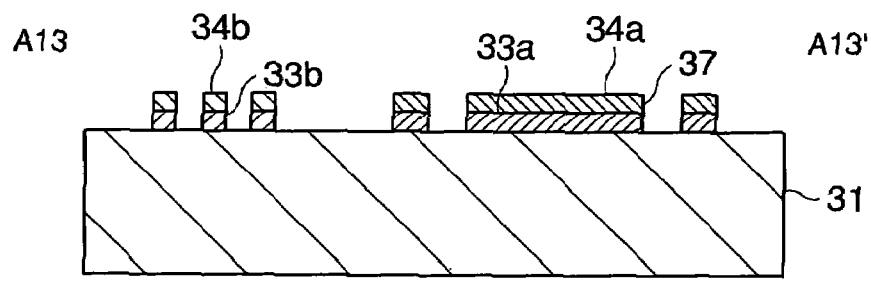
Figure 11C:
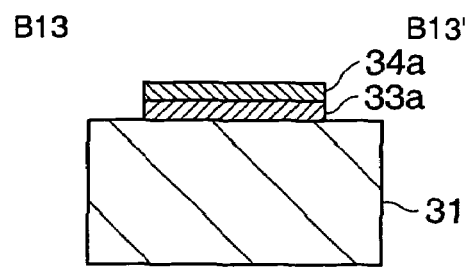

Next, as shown in FIGS. 11A to 11C, an opening 37 for exposing part of the semiconductor substrate 31 in the SOI configuration-forming region R12 is formed by etching the second semiconductor layer 34a and the first semiconductor layer 33a using the photoresist pattern 35 as a mask. Then, after completing the formation of the opening 37 in the SOI configuration-forming region R12, the photoresist pattern 35 is removed.

Figure 12A:
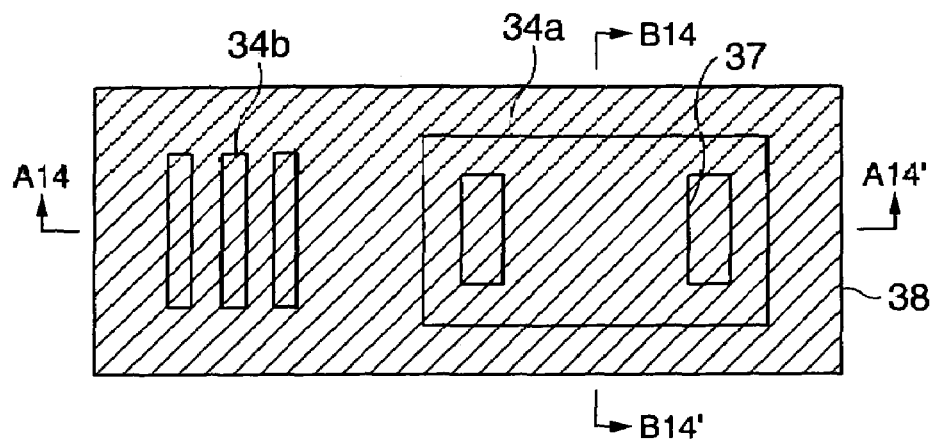
FIGS. 12A to 12C are yet other diagrams showing the method for manufacturing a semiconductor device according to the second embodiment of the invention.
Figure 12B:
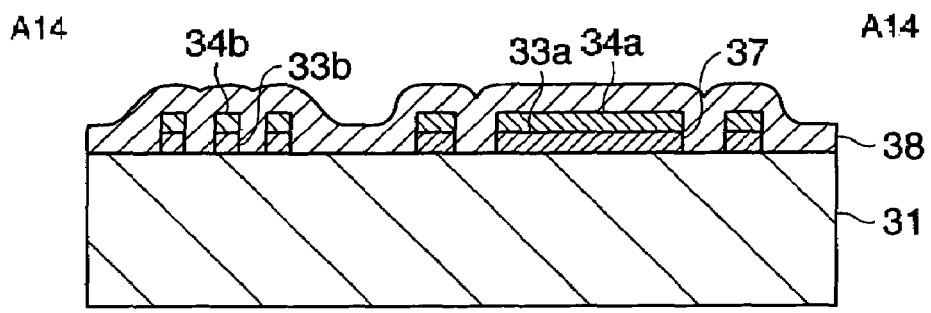
Figure 12C:
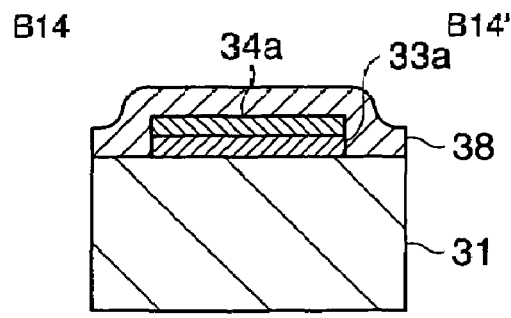

Next, as shown in FIGS. 12A to 12C, a supporter 38 is deposited all over the semiconductor substrate 31 by means of CVD, etc. In addition, the supporter 38 is deposited also on the side walls of the first semiconductor layer 33a and the second semiconductor layer 34a in the opening 37 so that the second semiconductor layer 34a can be supported by the semiconductor substrate 31.

Figure 13A:
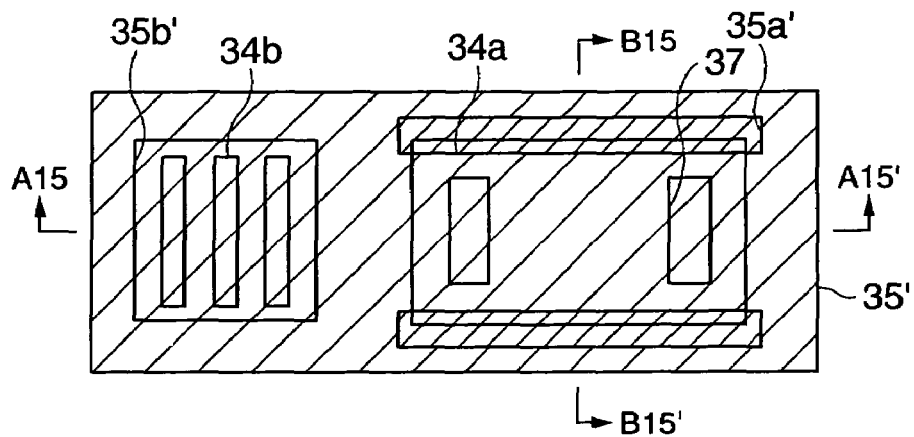
FIGS. 13A to 13C are yet other diagrams showing the method for manufacturing a semiconductor device according to the second embodiment of the invention.
Figure 13B:
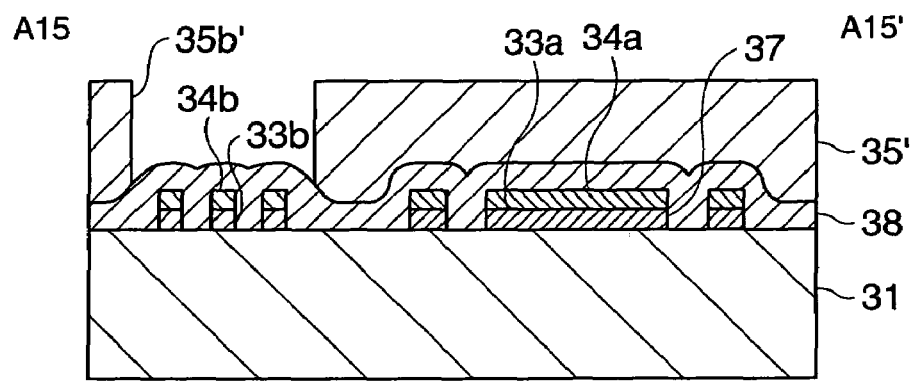
Figure 13C:
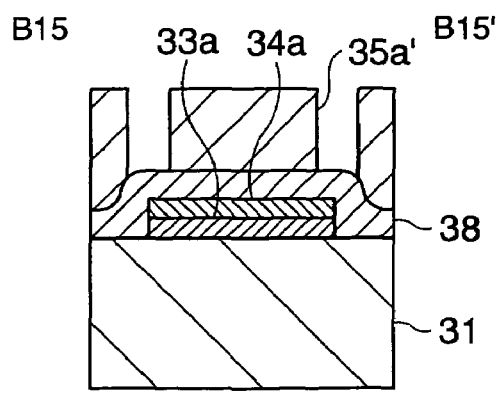

Next as shown in FIGS. 13A to 13C, by means of photolithography, a photoresist pattern 35' wherein an opening 35a' for exposing part of the second semiconductor layer 34a in the SOI configuration-forming region R12 and another opening 35b' for exposing the alignment mark-forming region R11 are provided is formed on the semiconductor substrate 31. In the above step for forming the photoresist pattern 35', having the openings 35a' and 35b', on the semiconductor substrate 31, the positioning of an exposure mask can be performed with reference to the first alignment mark that is configured of the first semiconductor layer 33b and the second semiconductor layer 34b.

Figure 14A:
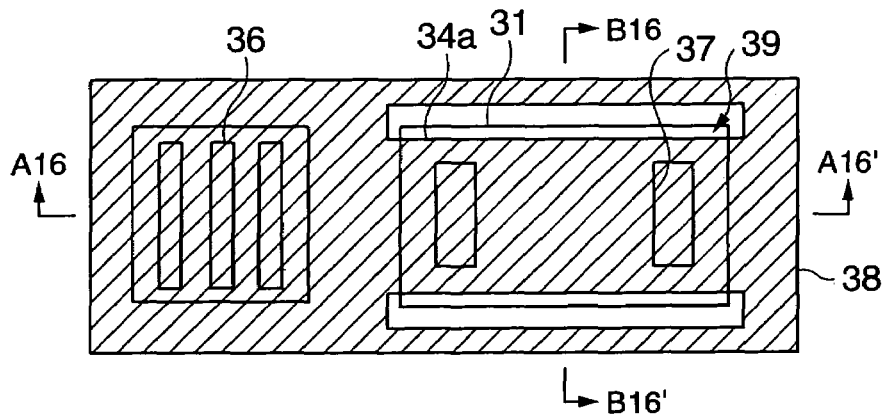
FIGS. 14A to 14C are yet other diagrams showing the method for manufacturing a semiconductor device according to the second embodiment of the invention.
Figure 14B:
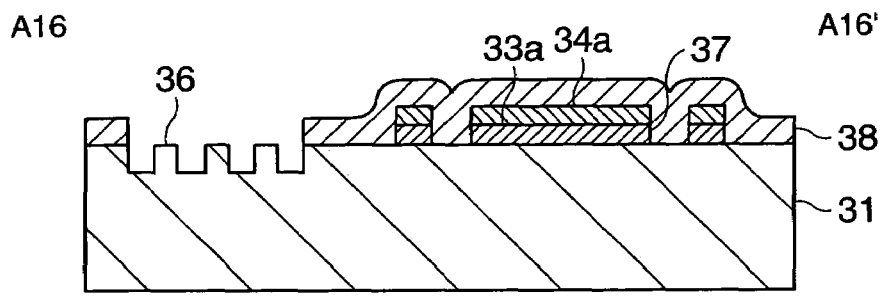
Figure 14C:
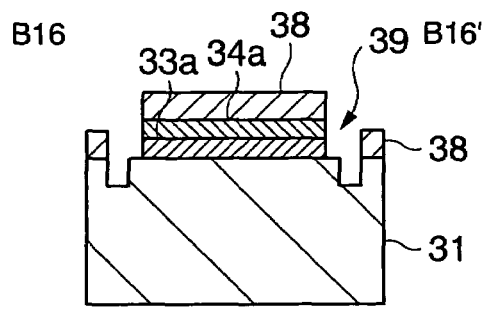

Next, as shown in FIGS. 14A to 14C, an exposing surface 39 for exposing part of the first semiconductor layer 33a in the SOI configuration-forming region R12 is formed by etching the semiconductor substrate 31, the supporter 38, the second semiconductor layer 34a, and the first semiconductor layer 33a using the photoresist pattern 35' as a mask. At the same time, after removing the second semiconductor layer 34b and the first semiconductor layer 33b in the alignment mark-forming region R11, a second alignment mark 36 is formed on the semiconductor substrate 31 in the alignment mark-forming region R11. Then, after completing the formation of the opening 37 in the SOI configuration-forming region R12 and the second alignment mark 36 in the alignment mark-forming region R11, the photoresist pattern 35' is removed. In the above step for forming the photoresist pattern 35', having the openings 35a' and 35b', on the semiconductor substrate 31, the positioning of an exposure mask can be performed with reference to the first alignment mark that is configured of the first semiconductor layer 33b and the second semiconductor layer 34b. In the above step, since the semiconductor substrate 31 in the alignment mark-forming region R11 is etched using the second semiconductor layer 34b and the first semiconductor layer 33b as a mask, the second alignment mark 36 can be provided self-alignedly in a position corresponding to the second semiconductor layer 34b and the first semiconductor layer 33b.

Next, by performing the same steps as in FIGS. 6A to 6C through to FIGS. 8A to 8C, a buried insulation layer can be formed under the second semiconductor layer 34a by removing the first semiconductor layer 33a under the second semiconductor layer 34a. At the same time, a device such as a transistor, etc. can be formed on the second semiconductor layer 34a.

By the above method, the second alignment mark 36 corresponding to the first alignment mark position can be formed in the alignment mark-forming region R11 after removing the first semiconductor layer 33b and the second semiconductor layer 34b that are formed in the alignment mark-forming region R11. Hence, even when the first semiconductor layer 33a under the second semiconductor layer 34a in the SOI configuration-forming region R12 is removed, the second semiconductor layer 34b in the alignment mark-forming region R11 can be prevented from becoming a cause of particle generation. Also, even when the heat treatment of a wafer is performed after a cavity is formed under the second semiconductor layer 34a in the SOI configuration-forming region R12, the contamination of the second semiconductor layer 34a due to a component contained in the first semiconductor layers 33a and 33b can be prevented and therefore the degradation of device properties can be prevented.

FIGS. 15A to 20A are plan views showing a method for manufacturing a semiconductor device according to a third embodiment of the invention. FIGS. 15B to 20B are cross sections that are respectively taken along the lines A21-A21' to A26-A26' in FIGS. 15A to 20A. FIGS. 15C to 20C are cross sections that are respectively taken along the lines B21-B21' to B26-B26' in FIGS. 15A to 20A.

Figure 15A:
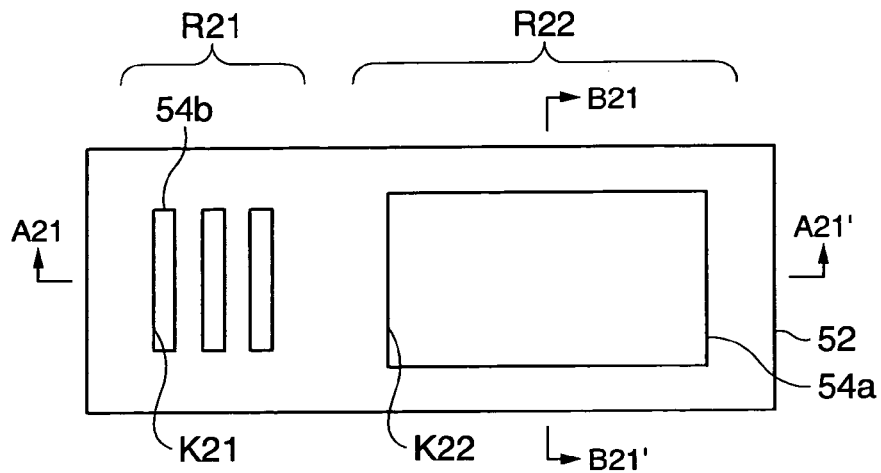
FIGS. 15A to 15C are diagrams showing a method for manufacturing a semiconductor device according to a third embodiment of the invention.
Figure 15B:
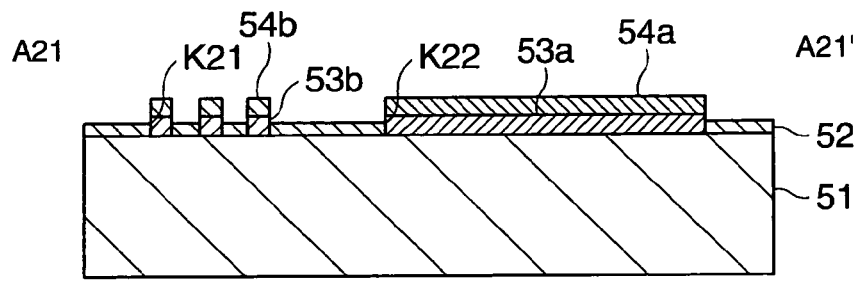
Figure 15C:
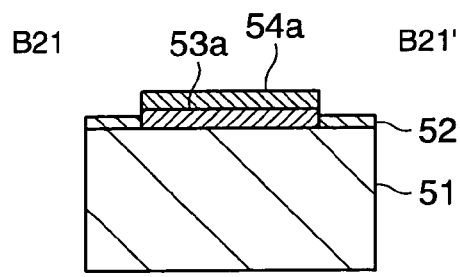

In FIGS. 15A to 15C, an alignment mark-forming region R21 for forming an alignment mark and an SOI configuration-forming region R22 for forming an SOI configuration are provided on a semiconductor substrate 51. Then, an oxide film 52 is formed all over the semiconductor substrate 51 by means of thermal oxidation, etc. Further, by patterning the oxide film 52 by means of photolithography and etching, an opening K21 for placing the alignment mark in the alignment mark-forming region R21 and another opening K22 for placing an SOI configuration in the SOI configuration-forming region R22 are formed. Furthermore, by performing selective epitaxial growth, a first semiconductor layer 53a and a second semiconductor layer 54a are sequentially formed in the SOI configuration-forming region R22, while another first semiconductor layer 53b and another second semiconductor layer 54b are sequentially formed in the alignment mark-forming region R21.

Figure 16A:
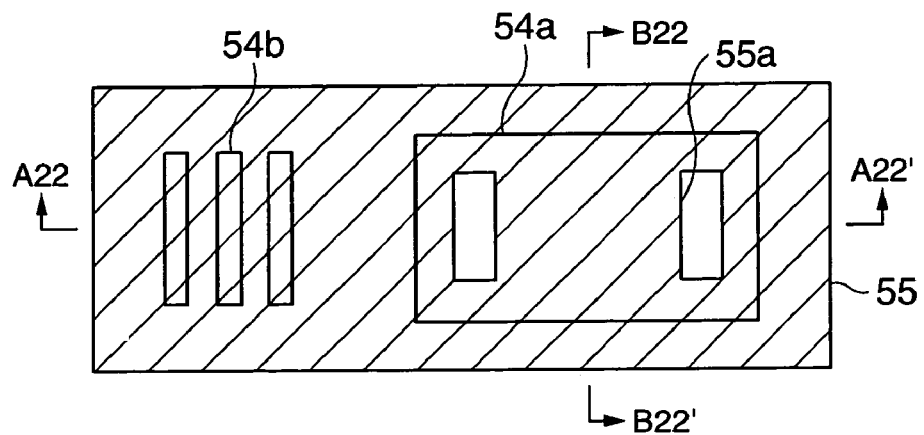
FIGS. 16A to 16C are other diagrams showing the method for manufacturing a semiconductor device according to the third embodiment of the invention.
Figure 16B:
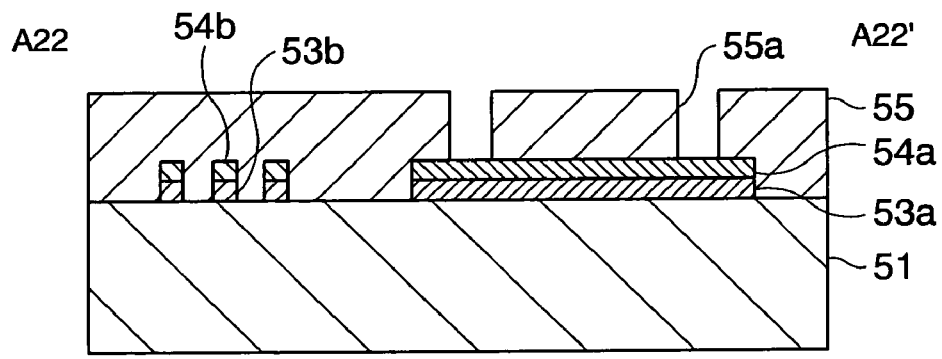
Figure 16C:
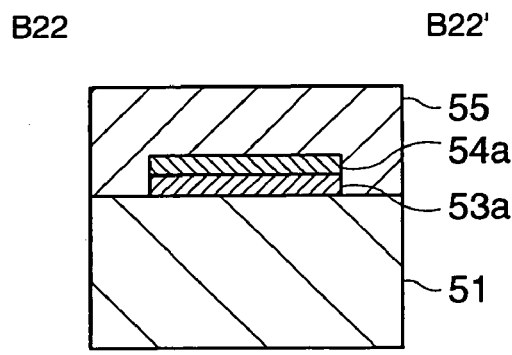

Next, as shown in FIGS. 16A to 16C, after forming the first semiconductor layers 53a and 53b and the second semiconductor layers 54a and 54b, the oxide film 52 on the semiconductor substrate 51 is removed. Then, by means of photolithography, a photoresist pattern 55 wherein an opening 55a for exposing part of the second semiconductor layer 54a in the SOI configuration-forming region R22 is provided is formed on the semiconductor substrate 51. In the above step for forming the photoresist pattern 55, having the opening 55a, on the semiconductor substrate 51, the positioning of an exposure mask can be performed with reference to the alignment mark that is configured of the first semiconductor layer 53b and the second semiconductor layer 54b.

Figure 17A:
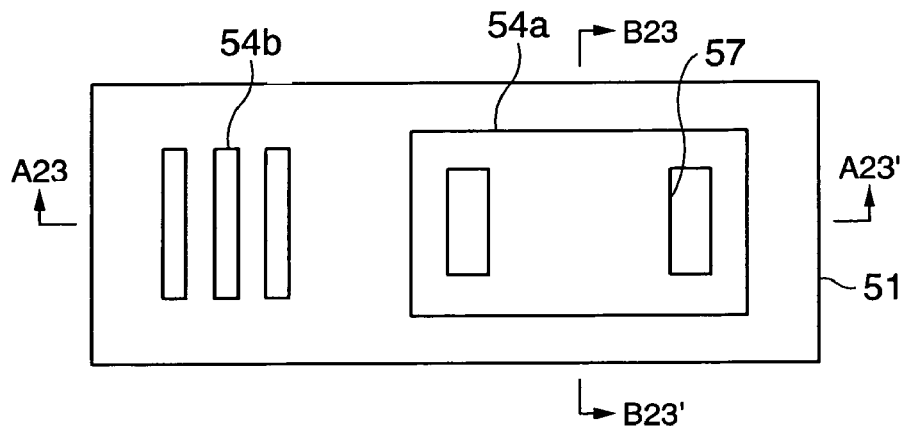
FIGS. 17A to 17C are yet other diagrams showing the method for manufacturing a semiconductor device according to the third embodiment of the invention.
Figure 17B:
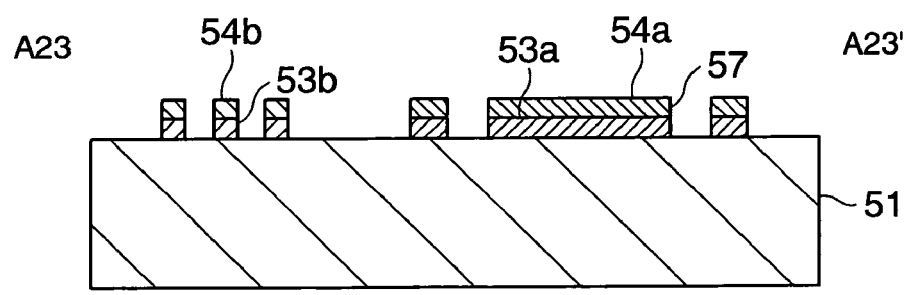
Figure 17C:
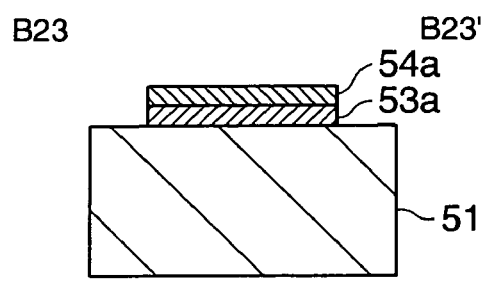

Next, as shown in FIGS. 17A to 17C, an opening 57 for exposing part of the semiconductor substrate 51 in the SOI configuration-forming region R22 is formed by etching the second semiconductor layer 54a and the first semiconductor layer 53a using the photoresist pattern 55 as a mask. Then, after completing the formation of the opening 57 in the SOI configuration-forming region R22, the photoresist pattern 55 is removed.

Figure 18A:
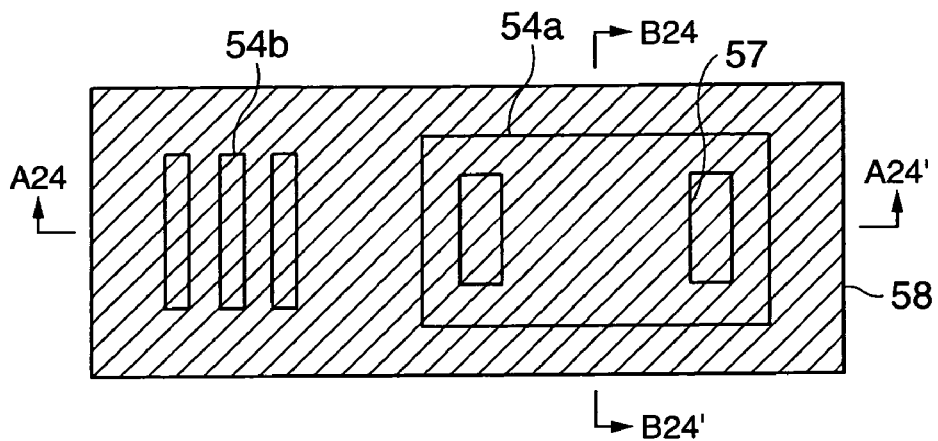
FIGS. 18A to 18C are yet other diagrams showing the method for manufacturing a semiconductor device according to the third embodiment of the invention.
Figure 18B:
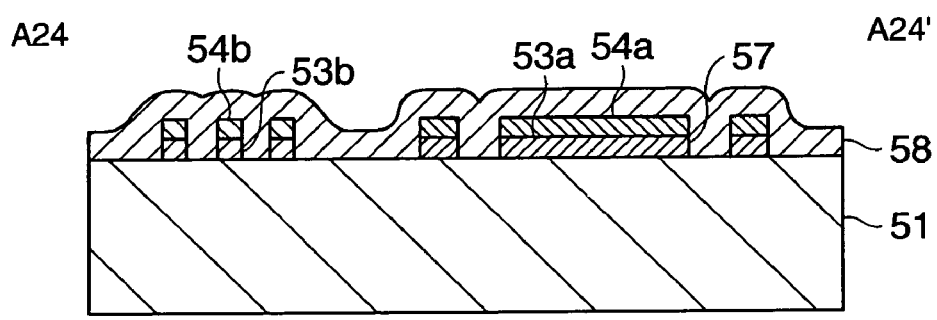
Figure 18C:
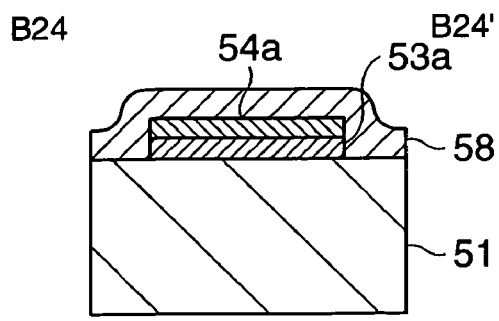

Next, as shown in FIGS. 18A to 18C, a supporter 58 is deposited all over the semiconductor substrate 51, by means of CVD, etc., so that the supporter 58 covers the first semiconductor layer 53b and the second semiconductor layer 54b. In addition, the supporter 58 is deposited also on the side walls of the first semiconductor layer 53a and the second semiconductor layer 54a in the opening 57 so that the second semiconductor layer 54a can be supported by the semiconductor substrate 51.

Figure 19A:
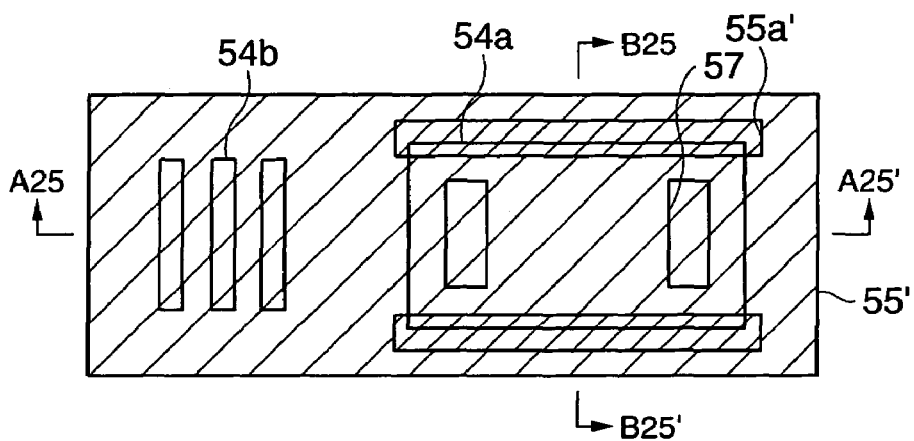
FIGS. 19A to 19C are yet other diagrams showing the method for manufacturing a semiconductor device according to the third embodiment of the invention.
Figure 19B:
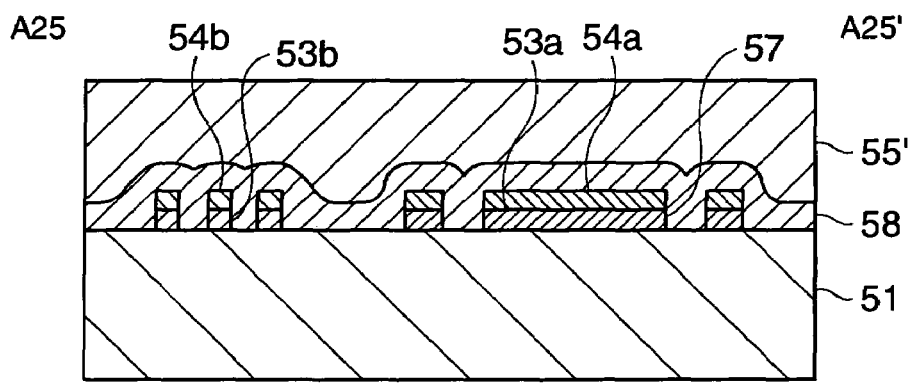
Figure 19C:
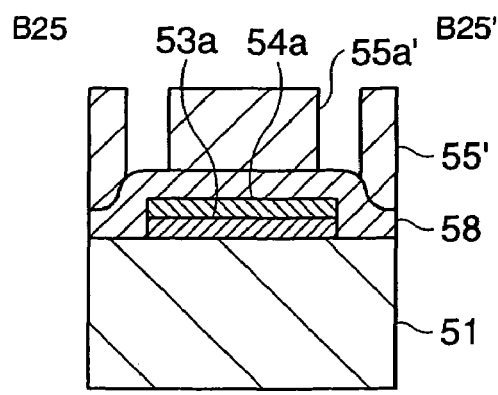

Next as shown in FIGS. 19A to 19C, by means of photolithography, a photoresist pattern 55' wherein an opening 55a' for exposing part of the second semiconductor layer 54a in the SOI configuration-forming region R22 is provided is formed on the semiconductor substrate 51. In the above step for forming the photoresist pattern 55', having the opening 55a', on the semiconductor substrate 51, the positioning of an exposure mask can be performed with reference to the alignment mark that is configured of the first semiconductor layer 53b and the second semiconductor layer 54b.

Figure 20A:
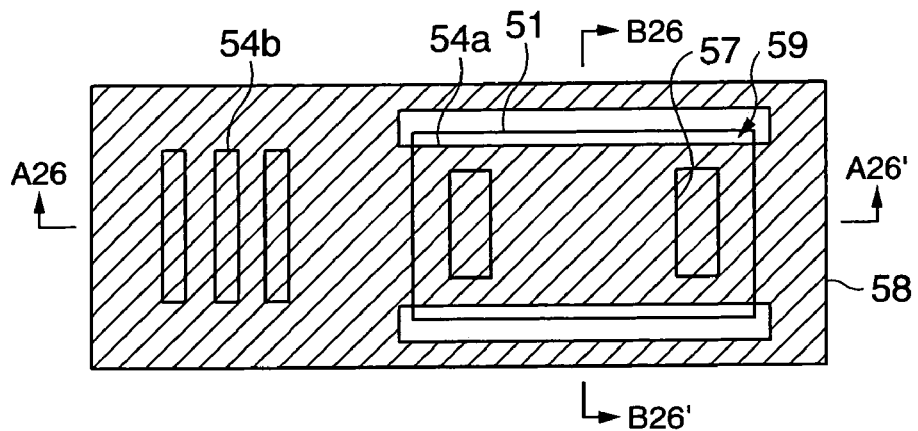
FIGS. 20A to 20C are yet other diagrams showing the method for manufacturing a semiconductor device according to the third embodiment of the invention.
Figure 20B:
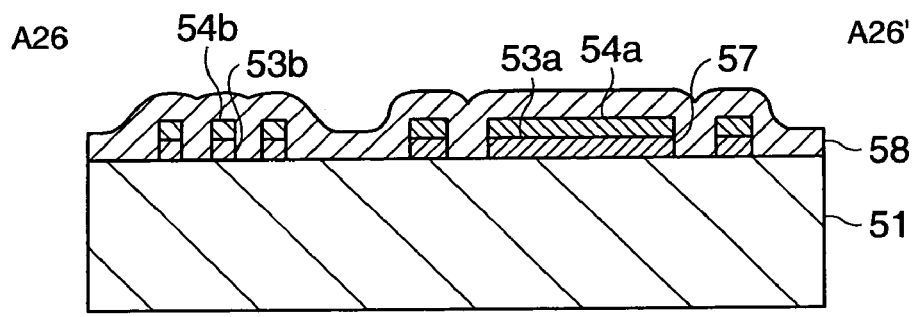
Figure 20C:
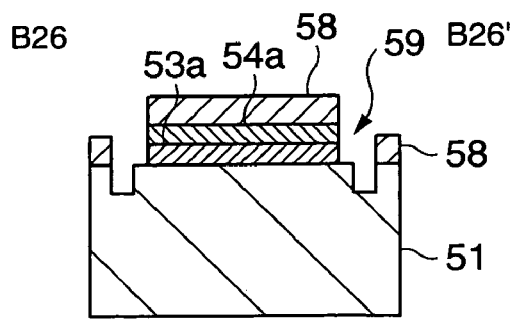

Next, as shown in FIGS. 20A to 20C, an exposing surface 59 for exposing part of the first semiconductor layer 53a in the SOI configuration-forming region R22 is formed by etching the supporter 58, the second semiconductor layer 54a, and the first semiconductor layer 53a using the photoresist pattern 55' as a mask. Then, after completing the formation of the exposing surface 59 in the SOI configuration-forming region R22, the photoresist pattern 55' is removed.

Next, by performing the same steps as in FIGS. 6A to 6C through to FIGS. 8A to 8C, a buried insulation layer can be formed under the second semiconductor layer 54a by removing the first semiconductor layer 53a under the second semiconductor layer 54a. At the same time, a device such as a transistor, etc. can be formed on the second semiconductor layer 54a.

By the above method, a cavity can be formed under the second semiconductor layer 54a in the SOI configuration-forming region R22, with the first semiconductor layer 53b and the second semiconductor layer 54b, which are formed in the alignment mark-forming region R21, covered with the supporter 58. Hence, even when the first semiconductor layer 53a under the second semiconductor layer 54a in the SOI configuration-forming region R22 is removed, the second semiconductor layer 54b in the alignment mark-forming region R21 can be prevented from becoming a cause of particle generation. Also, even when the heat treatment of a wafer is performed after a cavity is formed under the second semiconductor layer 54a in the SOI configuration-forming region R22, the contamination of the second semiconductor layer 54a due to a component contained in the first semiconductor layers 53a and 53b can be prevented and therefore the degradation of device properties can be prevented.

Figure 21A:
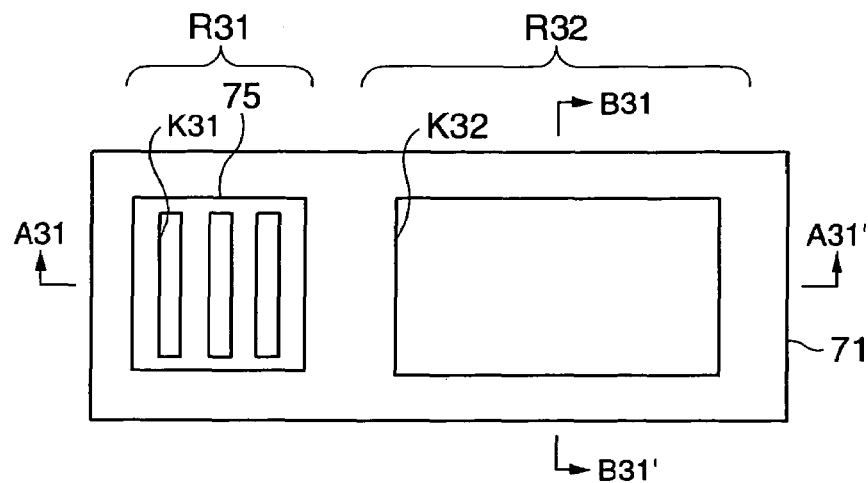
FIGS. 21A to 21C are diagrams showing a method for manufacturing a semiconductor device according to a fourth embodiment of the invention.
Figure 21B:
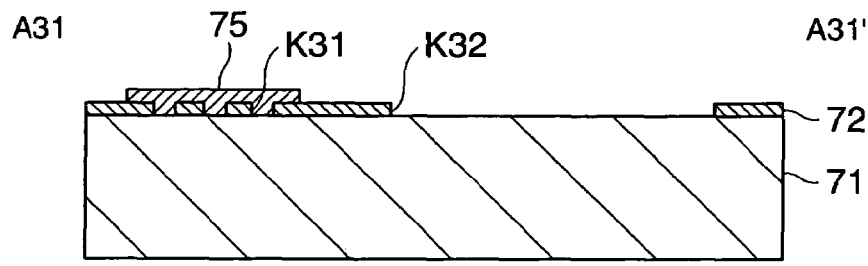
Figure 21C:
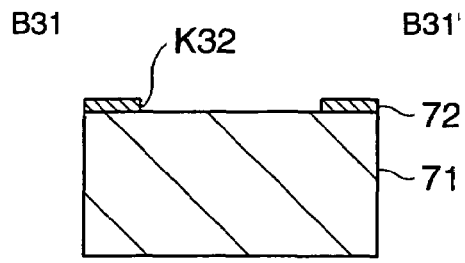
Figure 22A:
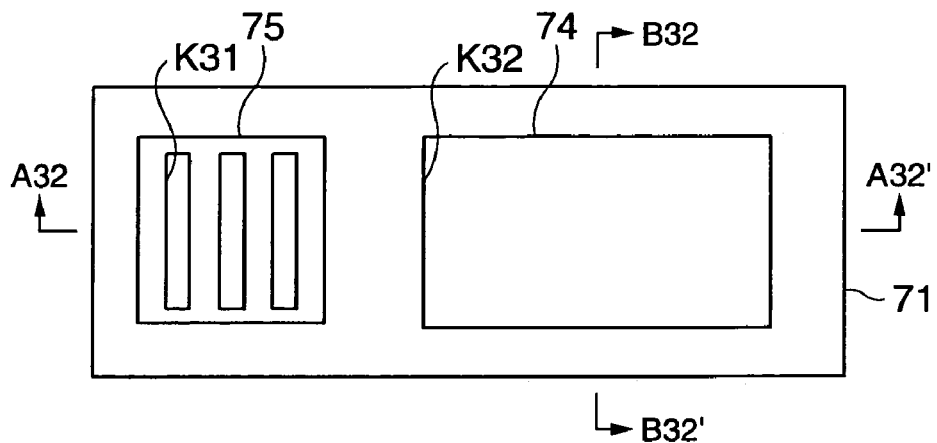
FIGS. 22A to 22C are other diagrams showing the method for manufacturing a semiconductor device according to the fourth embodiment of the invention.
Figure 22B:
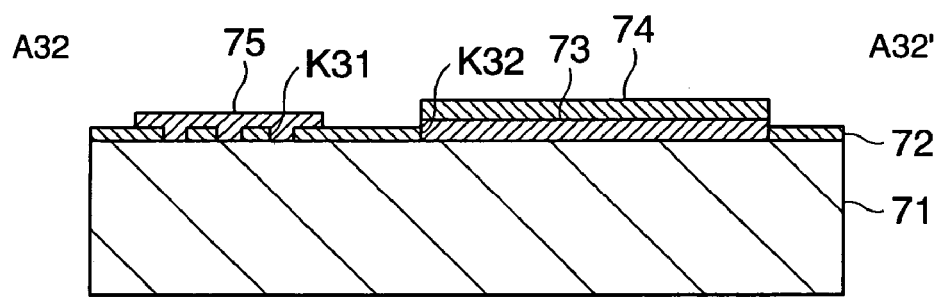
Figure 22C:
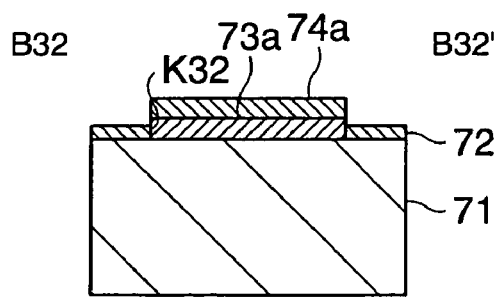

FIGS. 21A and 22A are plan views showing a method for manufacturing a semiconductor device according to a fourth embodiment of the invention. FIGS. 21B and 22B are cross sections that are respectively taken along the lines A31-A31' to A32-A32' in FIGS. 21A and 22A. FIGS. 21C and 22C are cross sections that are respectively taken along the lines B31-B31' to B32-B32' in FIGS. 21A and 22A.

In FIGS. 21A and 21C, an alignment mark-forming region R31 for forming an alignment mark 76 and an SOI configuration-forming region R32 for forming an SOI configuration are provided on a semiconductor substrate 71. Further, an oxide film 72 is formed all over the semiconductor substrate 71 by means of thermal oxidation, etc. Then, by patterning the oxide film 72 by means of photolithography and etching, an opening K31 serving as the alignment mark 71 in the alignment mark-forming region R31 and another opening K32 for placing an SOI configuration in the SOI configuration-forming region R32 are formed.

Further, an insulation film 75 is deposited all over the semiconductor substrate 71 by means of CVD, etc. Furthermore, by patterning the insulation film 75 by means of photolithography and etching, the insulation film 75 in the SOI configuration-forming region R32 is removed, with the opening K31 still covered. In addition, it is preferable to use a material, as the insulation film 75, having a refractive index different from that of the oxide film 72, such as a silicon nitride film, for example. In the above step wherein a material having a refractive index different from that of the oxide film 72 is used as the insulation film 75, even when the alignment mark 71 is covered with the insulation film 75, the shape of the alignment mark 71 can be prevented from being invisible.

Next as shown in FIGS. 22A to 22C, by performing selective epitaxial growth, a first semiconductor layer 73a and a second semiconductor layer 74a are sequentially formed in the SOI configuration-forming region R32. In the above step, by performing selective epitaxial growth after covering the opening K31 with the insulation film 75, the first semiconductor layer 73a and the second semiconductor layer 74a can be deposited only in the SOI configuration-forming region R32, preventing the first semiconductor layer 73a and the second semiconductor layer 74a from being deposited in the alignment mark-forming region R31.

Next, by performing the same steps as in FIGS. 2A to 2C through to FIGS. 8A to 8C, a buried insulation layer can be formed under the second semiconductor layer 74a by removing the first semiconductor layer 73a under the second semiconductor layer 74a. At the same time, a device such as a transistor, etc. can be formed on the second semiconductor layer 74a.

By the above method, the alignment mark for specifying the position of the SOI configuration-forming region R32 can be formed in the alignment mark-forming region R31 without forming the first semiconductor layer 73a and the second semiconductor layer 74a in the alignment mark-forming region R31. Hence, even when the first semiconductor layer 73a under the second semiconductor layer 74a is removed, the second semiconductor layer 74a can be prevented from becoming a cause of particle generation. Also, even when the heat treatment of a wafer is performed after a cavity is formed under the second semiconductor layer 74a, the contamination of the second semiconductor layer 74a due to a component contained in the first semiconductor layer 73a can be prevented and therefore the degradation of device properties can be prevented.

The entire disclosure of Japanese Patent Application No. 2005-094776, filed Mar. 29, 2005 is expressly incorporated by reference herein.

What is claimed is:

1. A method for manufacturing a semiconductor device, comprising:
    forming an insulation film pattern on a semiconductor layer having a first region and a second region;
    forming a first semiconductor film on the semiconductor layer;
    forming a second semiconductor film having an etching rate smaller than an etching rate of the first semiconductor film;
    removing the insulation film pattern that has been formed on the semiconductor layer;
    forming a first exposing region by referring to the second semiconductor film as an alignment mark, the first exposing region being formed by etching the second semiconductor film and the first semiconductor film;
    forming a supporter on the second semiconductor film having an etching rate smaller than an etching rate of the first semiconductor film, the supporter being formed such that the supporter supports the second semiconductor film in the second region;
    forming a second exposing region that exposes a side of the first semiconductor film, the second exposing a region being formed by referring to the alignment mark;
    forming a cavity by removing the first semiconductor film through the second exposing region;
    forming a buried oxide in the cavity;
    forming a first gate insulation film on the second semiconductor film;
    forming a first gate electrode on the gate insulation film, the first gate electrode being formed by referring to the alignment mark; and
    forming a first source region and a drain region in the second semiconductor film.

2. A method for manufacturing a semiconductor device, comprising:
    forming an insulation film on a semiconductor substrate having a first area and a second area;
    patterning the insulation film;
    depositing a first semiconductor film on the first area and the second area;
    depositing a second semiconductor film having an etching rate smaller than an etching rate of the first semiconductor film, the second semiconductor film being deposited on the first semiconductor film;
    removing the patterned insulation film from the semiconductor substrate;
    forming a first exposing region by referring to the second semiconductor film as an alignment mark, the first exposing region being formed by etching the second semiconductor film and the first semiconductor film;
    depositing an oxide portion having an etching rate smaller than an etching rate of the first semiconductor film, the oxide portion being formed on the semiconductor substrate such that the oxide portion supports the second semiconductor film;
    forming a second exposing region on the second area, the second exposing region being formed such that a side of the second semiconductor film is exposed;
    forming a cavity by etching the first semiconductor film through the second exposing region;
    forming a buried insulation layer, the buried insulation layer being formed such that the cavity is buried by heating the first semiconductor film on the first area through the second exposing region;
    forming a gate electrode on the second semiconductor film; and
    forming a source region and a drain region in the second semiconductor film.

3. A method for manufacturing a semiconductor device, comprising:
    forming an insulation film on a semiconductor substrate having a first area and a second area;

patterning the insulation film on the semiconductor substrate, the insulation film being patterned such that an alignment mark is formed on the first area;

depositing a first semiconductor film on the semiconductor substrate;

depositing a second semiconductor film having an etching rate smaller than an etching rate of the first semiconductor film, the second semiconductor film being formed on the first semiconductor film;

removing the insulation film that has been formed on the semiconductor substrate;

forming a first exposing region by referring to the second semiconductor film as an alignment mark, the first exposing region being formed by etching the second semiconductor film and the first semiconductor film;

forming a supporter having an etching rate smaller than an etching rate of the first semiconductor film, the supporter being formed such that the supporter holds in place the second exposing region;

forming a second exposing region, the second exposing region being formed such that a side of the first semiconductor film on the second area is exposed;

forming a cavity by etching the first semiconductor film through the second exposing region;

forming a buried insulation layer that is formed in the cavity;

forming a first gate electrode on the second semiconductor film; and forming a source and drain region in the second semiconductor film.

4. The method for manufacturing a semiconductor device according to claim 1, further comprising:

forming a second gate electrode in a third region, which is provided on the semiconductor substrate; and forming a second source region and a second drain region such that the second source region and the second drain region sandwich the second gate electrode.

* * * * *